United States Patent [19]

Nonaka et al.

[11] Patent Number: 5,757,244

[45] Date of Patent: May 26, 1998

[54] DIGITAL CONTROL TYPE OSCILLATION CIRCUIT OF PORTABLE TELEPHONE, CRYSTAL RESONATOR OSCILLATION FREQUENCY CALCULATING METHOD, AND OUTPUTFREQUENCY CORRECTING METHOD

[75] Inventors: Youji Nonaka; Yuji Ishida; Youji Suwa; Toshikazu Hiramoto, all of Yokohama, Japan

[73] Assignee: Kyocera Corporation, Kyoto, Japan

[21] Appl. No.: 606,072

[22] Filed: Feb. 23, 1996

[51] Int. Cl.[6] ........................................ H03L 1/02
[52] U.S. Cl. ........................................ 331/176; 310/315
[58] Field of Search ........................ 331/176, 158; 310/315, 346

[56] References Cited

U.S. PATENT DOCUMENTS

| 4,254,382 | 3/1981 | Keller et al. | 331/116 R |
| 4,922,212 | 5/1990 | Roberts et al. | 331/176 |
| 5,117,206 | 5/1992 | Imamura | 331/158 |
| 5,392,005 | 2/1995 | Bortolini et al. | 331/44 |
| 5,548,252 | 8/1996 | Watanabe et al. | 332/176 |

FOREIGN PATENT DOCUMENTS 58-184809  10/1983  Japan.

Primary Examiner—Timothy P. Callahan
Assistant Examiner—An T. Luu
Attorney, Agent, or Firm—Loeb & Loeb LLP

[57] ABSTRACT

In a portable telephone which uses a CPU, a memory, a temperature sensor, a D/A converter, and an A/d converter as control elements, and which has an oscillation circuit including a crystal resonator and a variable-capacitance diode, temperature compensation of the output frequency is made by using these existing control elements. The memory is previously stored with control information for correcting an output frequency drift of the portable telephone caused by a temperature change. The temperature of the oscillation circuit is detected with the temperature sensor and converted into a digital value in the A/D converter. The CPU reads control information corresponding to the detected temperature from the memory and applies it to the variable-capacitance diode of the oscillation circuit through the D/A converter, thereby maintaining the output frequency at a constant level. Also disclosed is a method of efficiently calculating an oscillation frequency of a crystal resonator with a reduced number of points of measurement for a temperature characteristic of the crystal resonator. A method of accurately carrying out the above-described temperature compensation is also disclosed.

5 Claims, 22 Drawing Sheets

DIGITAL CONTROL TYPE OSCILLATION CIRCUIT OF PORTABLE TELEPHONE, CRYSTAL RESONATOR OSCILLATION FREQUENCY CALCULATING METHOD, AND OUTPUTFREQUENCY CORRECTING METHOD

BACKGROUND OF THE INVENTION

The present invention relates to a digital control type oscillation circuit of a portable telephone, and also relates to a crystal resonator oscillation frequency calculating method and a frequency correcting method, which are suitably used for the oscillation circuit.

FIG. 1 shows an example of the arrangement of a conventional digital temperature-compensated crystal oscillator. As illustrated in the figure, the digital temperature-compensated crystal oscillator 60 includes an oscillation circuit 61 which uses a crystal resonator 45 (see FIG. 2), a temperature sensor 62, an A/D converter 63, a CPU (Central Processing Unit) 64, a D/A converter 65, an integrating circuit 66, and a storage circuit (memory) 67.

Crystal resonators have the temperature characteristic that the oscillation frequency changes with variations in temperature. Therefore, in the oscillation circuit 61, which uses a crystal resonator as an oscillation device, the oscillation frequency is corrected by applying a control voltage corresponding to a temperature change, thereby maintaining the output frequency at a constant level. For this purpose, the storage circuit 67 has been previously stored with control information (voltage values) for correcting a resonance frequency drift caused by a temperature change. The temperature of the oscillation circuit 61 is detected with the temperature sensor 62. The detected temperature is converted into a digital value in the A/D converter 63 and then output to the CPU 64. The CPU 64 refers to the correction information stored in the storage circuit 67 and outputs a control signal (digital signal) corresponding to the detected temperature to the D/A converter 65. The D/A converter 65 converts the control signal into an analog value and outputs it to the oscillation circuit 61 through the integrating circuit 66, thus maintaining the output frequency at a predetermined constant level.

The digital temperature-compensated crystal oscillator 60 requires the temperature sensor 62, the A/D converter 63, the CPU 64, the D/A converter 65, the integrating circuit 66 and the storage circuit 67, as described above, and it is therefore complicated in arrangement and large in size.

Further, the digital temperature-compensated crystal oscillator 60 carries out the temperature compensation in accordance with the temperature characteristic of the crystal resonator 45. Therefore, in a case where the digital temperature-compensated crystal oscillator 60 is used as an oscillation circuit of a portable telephone, when the crystal resonator 45 has broken down, not the crystal resonator 45 alone but the whole oscillator must be replaced with a new one; this is costly.

Further, when the digital temperature-compensated crystal oscillator 60 is used as an oscillator of a portable telephone, the controlled object of temperature compensation is the frequency at the output terminal of the oscillation circuit 61. Therefore, the output frequency at the antenna of the portable telephone undesirably has an error introduced in a high-frequency section, e.g. a VCO.

FIG. 2 shows an example of the arrangement of the oscillation circuit 61, shown in FIG. 1. The oscillation frequency of the oscillation circuit 61 is determined by the electrostatic capacities of the crystal resonator 45, capacitors 43, 44, 46 and 47 and variable-capacitance diode 42. A frequency signal oscillated from the crystal resonator 45 is amplified by a transistor 50 and output from an output terminal $T_{out}$ through a capacitor 56.

The crystal resonator 45 has the temperature characteristic that the resonance frequency changes (on the order of ±10 ppm) with variations in temperature. Therefore, the resonance frequency variation of the crystal resonator 45 caused by temperature change is corrected by controlling a voltage applied to the variable-capacitance diode 42 (i.e. a voltage applied to an input terminal $T_{in}$). It is necessary in order to effect the frequency correction with high accuracy to calculate a change in the resonance frequency of the crystal resonator 45 caused by a temperature change with high accuracy. However, the frequency deviation of an AT cut crystal resonator, for example, is expressed by a polynomial, as described later. Therefore, data measured at a large number of measuring points is needed for accurate calculation of a change in the resonance frequency caused by a temperature change. Thus, a troublesome operation must be carried out in order to prepare such measured data.

Further, in the conventional oscillation circuit, a resonance frequency change of the crystal resonator caused by a temperature change is corrected by controlling the voltage applied to the variable-capacitance diode 42, as described above. However, each individual variable-capacitance diode has its own control voltage-frequency deviation characteristic; there are a variety of control voltage-frequency deviation characteristics which differ in slope K, as shown in FIG. 3. The conventional practice is to select a variable-capacitance diode having a slope K close to a predetermined slope and to store the value thereof in the memory 67 as the slope K of the variable-capacitance diode 42 in advance. Accordingly, it takes a great deal of time to select a proper variable-capacitance diode. Moreover, an error is introduced into the control voltage (correction voltage) because the slope of the control voltage-frequency deviation characteristic is not accurate. Further, the slopes K of the straight lines representing control voltage-frequency deviation characteristics are not uniform over the entire control voltage range, as shown in FIG. 3. That is, the control voltage-frequency deviation characteristic of each variable-capacitance diode is given by an approximately linear expression. Accordingly, an error arises unless correction is made using a control voltage which is given by a linear expression with a slope K obtained in an appropriate control voltage range.

SUMMARY OF THE INVENTION

An object of the present invention is to provide a digital control type oscillation circuit for use in a portable telephone, which is arranged such that temperature compensation for a crystal oscillator is made by effectively using control elements which have already been used in the portable telephone, and that the controlled object of temperature compensation is the output frequency at the antenna of the portable telephone.

To attain the above-described object, the present invention provides a digital control type oscillation circuit for use in a portable telephone which uses a CPU, a memory, a temperature sensor, a D/A converter, and an A/D converter as control elements. As shown in FIG. 4, the memory 20 is previously stored with control information for correcting a drift of the output frequency of the portable telephone caused by a temperature change. The temperature of the oscillation circuit 22 is detected with the temperature sensor 23. The detected temperature is converted into a digital signal in the A/D converter 24, and the digital signal is input to the CPU 1. The CPU 1 outputs a correction signal according to the control information stored in the memory 20. The correction signal is converted into an analog value in the D/A converter 21 and then input to the oscillation circuit 22 as a control voltage, thereby controlling the output frequency of the portable telephone at a predetermined constant level. Thus, the temperature sensor 23, the A/D converter 24, the CPU 1, the memory 20 and the D/A converter 21, which have already been provided in the portable telephone, can also be used as control elements necessary for temperature compensation. Further, the controlled object of temperature compensation is the output frequency at the antenna 9, and it can be used as temperature compensation data.

Another object of the present invention is to provide a method of efficiently calculating an oscillation frequency of a crystal resonator with a reduced number of points of measurement for a temperature characteristic of the crystal resonator.

To attain the above-described object, the present invention provides a method of calculating an oscillation frequency of a crystal resonator by obtaining each coefficient of the temperature characteristic of the crystal resonator, which is expressed in the form of a polynomial of degree n with respect to temperature. The temperature characteristic, which is expressed by a polynomial of degree n with respect to temperature, is approximated with a cubic expression. A mean value is used as the third-degree coefficient of the cubic expression, and the second-degree coefficient, the first-degree coefficient and the constant are determined from three temperature points and frequency data measured at the three temperature points, thereby calculating an oscillation frequency. Thus, by using a mean value as the third-degree coefficient, an oscillation frequency deviation can be calculated with a sufficiently high accuracy from data measured at three measuring points, whereas data measured at four or more measuring points has heretofore been needed to obtain the third-, second- and first-degree coefficients and the constant and to calculate an oscillation frequency deviation.

The oscillation frequency calculating method may be carried out as follows: A mean value is used as each of the third- and second-degree coefficients of the cubic expression representing the temperature characteristic, and the first-degree coefficient and the constant are determined from two temperature points and frequency data measured at the two temperature points, thereby calculating an oscillation frequency. Thus, by using a mean value as each of the third- and second-degree coefficients, it is possible to calculate an oscillation frequency deviation from data measured at two measuring points. Accordingly, it is possible to reduce the number of manhours and the cost on account of the reduction in the number of data measuring points.

Still another object of the present invention is to provide a frequency correcting method for a digital control type oscillation circuit, in which a linear expression representing the relationship between the frequency deviation and the control voltage is obtained for each variable-capacitance diode to be used for temperature compensation in order to effect voltage control, thereby improving the frequency accuracy.

To attain the above-described object, as shown in FIG. 10, a frequency deviation characteristic relative to the control voltage is expressed in the form of a linear expression for a linear portion including a point at which the frequency deviation is zero for each variable-capacitance diode to be used, and the first-degree coefficient of the linear expression and the temperature characteristic of a crystal resonator are stored in a memory in advance. A CPU calculates a frequency deviation from the temperature characteristic of the crystal resonator according to the temperature detected with a temperature sensor, obtains a control voltage to be applied to the variable-capacitance diode from the linear expression expressed by the first-degree coefficient, and applies the control voltage to the variable-capacitance diode, thereby controlling the output frequency at a predetermined constant level. Thus, according to the method of the present invention, the frequency deviation characteristic relative to the control voltage is expressed in the form of a linear expression for a linear portion including a point at which the frequency deviation is zero for each variable-capacitance diode to be used, and a slope K is set according to measured values. Therefore, accurate frequency control can be effected without an error which has heretofore been caused by characteristic variation.

A further object of the present invention is to provide a frequency control method for a digital control type oscillation circuit which makes it possible to readily use even a crystal resonator having a frequency-temperature characteristic which differs from a reference characteristic to a considerable extent.

To attain the above-described object, the present invention provides a method of controlling the oscillation frequency of a digital control type oscillation circuit having a control section which is adapted to correct a drift of the resonance frequency of a crystal resonator, which is caused by a temperature change, by detecting a temperature change of the crystal resonator with a temperature sensor and controlling a voltage to be applied to a variable-capacitance element, thereby controlling the oscillation frequency of the oscillation circuit at a constant level. The control section is provided with a storage circuit. At least three appropriate temperature points are selected, and control voltages for correcting a frequency deviation of the crystal resonator are measured at the selected temperature points. Then, a cubic correction curve is determined from the values measured at the measuring points, and the coefficients of the correction curve are stored in the storage circuit in advance. A control voltage corresponding to a temperature measured with the temperature sensor is calculated from the cubic correction curve, and the control voltage is applied to the variable-capacitance element in order to control the electrostatic capacity of the variable-capacitance element, thereby maintaining the oscillation frequency of the oscillation circuit at a constant level.

The frequency control method may be carried out as follow: Three appropriate temperature points are selected, and a control voltage for correcting a frequency deviation of the crystal resonator is measured at each of the three temperature points. Then, a correction curve represented by a cubic expression is determined from the values measured at the three temperature points, and the coefficients of the cubic correction curve are stored in the storage circuit in advance. A control voltage corresponding to a temperature measured with a temperature sensor is calculated from the cubic correction curve, and the control voltage is applied to the variable-capacitance element in order to control the electrostatic capacity of the variable-capacitance element, thereby maintaining the oscillation frequency of the oscillation circuit at a constant level.

According to the above-described method, a frequency correction curve is calculated from values measured at three measuring points, and the coefficients (temperature coefficients) of the frequency correction curve are stored in the storage circuit. Therefore, the required storage capacity is minimized, and the number of manhours is also reduced. Accordingly, it is possible to construct an oscillation circuit capable of accurate temperature compensation at reduced cost. Further, it is possible to readily use even a crystal resonator having a frequency-temperature characteristic which differs from a reference characteristic to a considerable extent because a correction curve for each crystal resonator is directly obtained. Thus, the frequency control method is superior in flexibility to the conventional technique.

A still further object of the present invention is to provide a frequency correcting method for a digital control type oscillation circuit which achieves an improvement in the frequency accuracy by controlling a control voltage to be applied to a variable-capacitance diode used for temperature compensation in such a manner that the control voltage-frequency deviation characteristic of the variable-capacitance diode is divided into a plurality of control sections, and the control voltage is controlled on the basis of data stored for a particular control section.

To attain the above-described object, as shown in FIG. 19, the control voltage-frequency deviation characteristic of a variable-capacitance diode to be used for temperature compensation is appropriately divided into a plurality of control sections (three sections in the illustrated example). The frequency deviation in each control section is given by a linear expression with respect to control voltage, and the first-degree coefficient of the linear expression and the temperature characteristic of the crystal resonator are stored in a memory in advance. A CPU calculates a frequency deviation from the temperature characteristic of the crystal resonator according to a temperature detected with a temperature sensor, obtains a control voltage to be applied to the variable-capacitance diode by using the first-degree coefficient in the corresponding control section, and applies the control voltage to the variable-capacitance diode, thereby controlling the output frequency at a predetermined constant level.

Thus, according to the above-described method, the control voltage-frequency deviation characteristic of a variable-capacitance diode to be used for temperature compensation is divided into a plurality of control sections, and a slope K of the variable-capacitance diode is set for each control section on the basis of measured values. Therefore, frequency deviations (errors) reduce in all the control sections, and thus it is possible to effect accurate frequency control.

DESCRIPTION OF THE PREFERRED EMBODIMENTS

Figure 4:
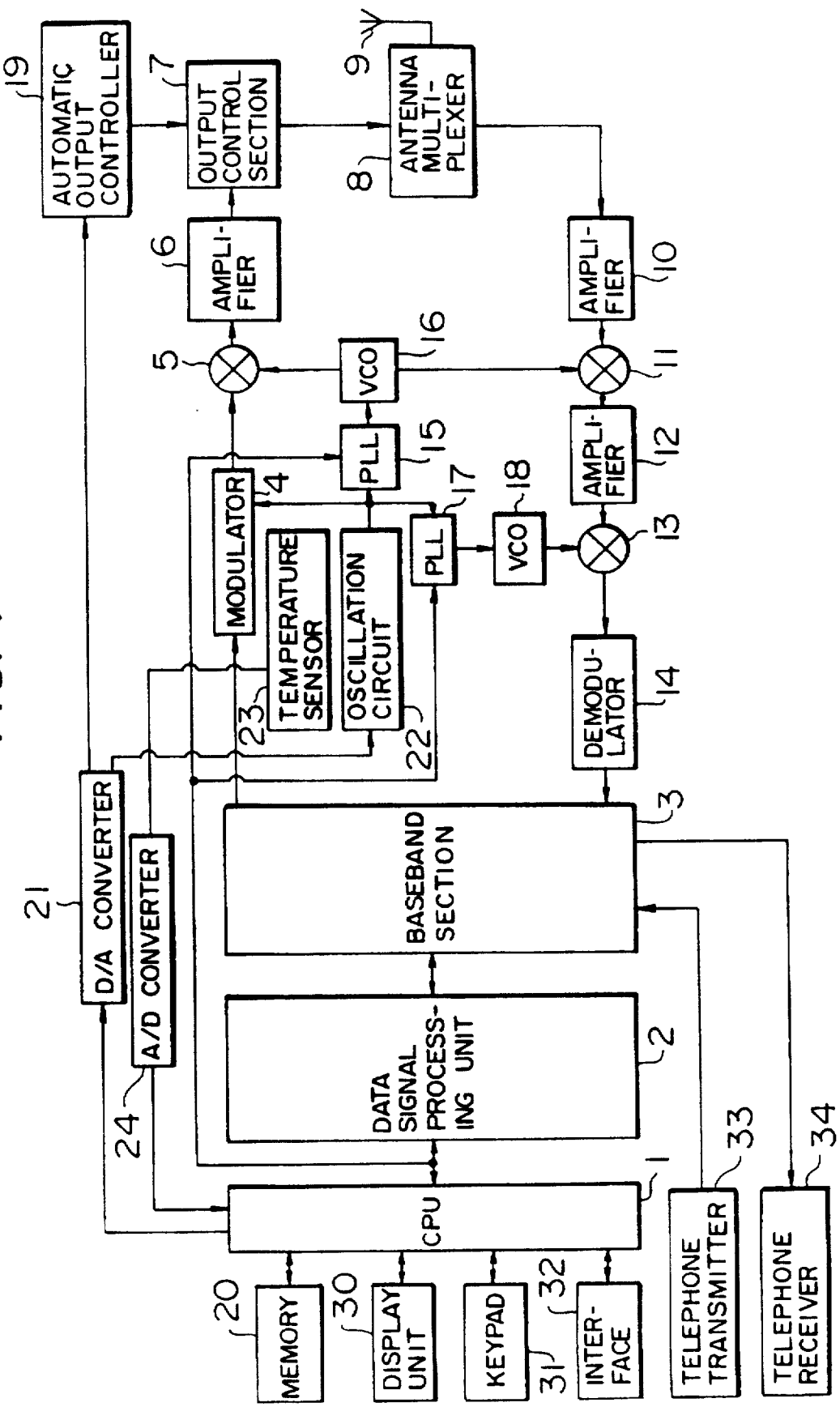
FIG. 4 shows the arrangement of a portable telephone which uses a digital control type oscillation circuit according to the present invention.

One embodiment of the present invention will be described below in detail with reference to the accompanying drawings. FIG. 4 is a block diagram showing an example of the arrangement of a portable telephone which uses a digital control type oscillation circuit according to the present invention. As illustrated in the figure, a portable telephone which uses a digital control type oscillation circuit according to the present invention includes a CPU (Central Processing Unit) 1, a data signal processing unit 2, a baseband section 3 for transmitting and receiving processing, a modulator 4, a mixer 5 serving as a frequency converter, an amplifier 6, an output control section 7, an antenna multiplexer 8, an antenna 9, an amplifier 10, a mixer 11, an amplifier 12, a mixer 13, a demodulator 14, a PPL (Phase Locked Loop) 15, a VCO (Voltage-Controlled Oscillator) 16, a PPL 17, a VCO 18, an automatic output controller 19, a memory 20 for storing data, a D/A converter 21, an oscillation circuit 22, a temperature sensor 23, an A/D converter 24, a display unit 30, a keypad 31 for inputting a dial signal, an interface 32 for connection with an external device, a telephone transmitter 33, and a telephone receiver 34. It should be noted that the oscillation circuit 22 is the same as that shown in FIG. 2.

A dial signal input from the keypad 31 is processed in the CPU 1 and displayed on the display unit 30. The signal that is processed in the CPU 1 is further processed in the data signal processing unit 2 and the baseband section 3 as a signal to be transmitted. Then, the signal is modulated in the modulator 4, frequency-converted in the mixer 5, amplified in the amplifier 6, and supplied to the antenna 9 via the output control section 7 and the antenna multiplexer 8. Then, the signal is transmitted from the antenna 9. A speech signal to be transmitted is supplied from the telephone transmitter 33 to the baseband section 3, and it is similarly processed and transmitted.

A signal from the other party is received by the antenna 9 and supplied to the amplifier 10 via the antenna multiplexer 8. The signal amplified in the amplifier 10 is frequency-converted in the mixer 11, amplified in the amplifier 12, frequency-converted in the mixer 13, demodulated in the demodulator 14, processed in the baseband section 3 as a received signal, and output from the telephone receiver 34 as speech.

The oscillation circuit 22 outputs a constant frequency, and the output frequency is supplied to the modulator 4 and the PPL 15. Thus, the output frequency of the VCO 16 is controlled by the output of the PPL 15. The mixer 5 mixes together the output signal of the modulator 4 and the output frequency of the VCO 16, thereby converting the frequency of the output signal to a predetermined transmit frequency. The CPU 1 controls the PPL 15 so as to oscillate a predetermined frequency according to the working channel. The received signal from the amplifier 10 is also mixed with the output frequency of the VCO 16 in the mixer 11, thereby being frequency-converted.

The oscillation circuit 22 also outputs a constant frequency to the PPL 17 to control the output frequency of the VCO 18. The mixer 13 mixes together the received signal from the amplifier 12 and the output frequency of the VCO 18, thereby converting the frequency of the received signal to a predetermined frequency. The CPU 1 adjusts the PPL 17 to thereby control the VCO 18 so that the frequency of the received signal is converted to a predetermined frequency according to the receive channel frequency.

Next, the temperature compensating control of the oscillation circuit 22 will be explained below. The memory 20 has been previously stored with correction data (control voltage values) for correcting a drift of the output frequency at the antenna 9 caused by a temperature change. The temperature sensor 23 detects a temperature of the oscillation circuit 22. The detected temperature is converted into a digital value in the A/D converter 24 and then output to the CPU 1. The CPU 1 refers to the correction data stored in the memory 20, and outputs a control voltage value (digital signal) corresponding to the detected temperature to the D/A converter 21. The D/A converter 21 converts the control voltage, which is a digital signal, into an analog value, and outputs it to the oscillation circuit 22 to control the frequency, thereby maintaining the output frequency at the antenna 9 at a predetermined constant level.

Portable telephones are usually used under severe environmental conditions. Therefore, the temperature sensor 23 for detecting a temperature has heretofore been used so that the portable telephone is adaptable to changes in temperature. The D/A converter 21 has also heretofore been used as a device for converting a signal to be input to the automatic output controller 19 or a digital speech signal into an analog signal. The A/D converter 24 has also been used as a device for converting speech into a digital signal. Needless to say, the CPU 1 and the memory 20 have also been used for control.

Figure 1:
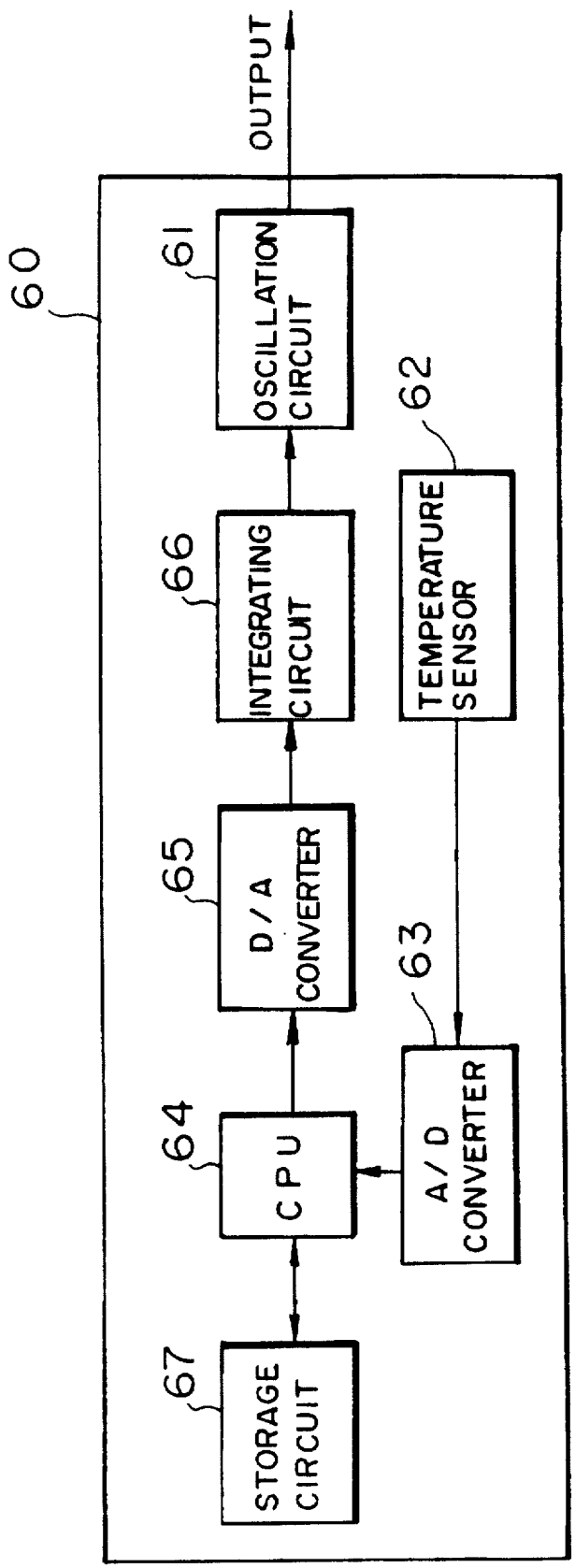
FIG. 1 shows the arrangement of a conventional digital temperature-compensated crystal oscillator.

The portable telephone arranged as shown in FIG. 4 is provided with the same temperature compensating function as that of the digital temperature-compensated crystal oscillator arranged as shown in FIG. 1 by making use of the temperature sensor 23, the D/A converter 21, the A/D converter 24, the CPU 1 and the memory 20, which have already been provided in the portable telephone as control elements. That is, these control elements, which have already been provided in the portable telephone, are used for temperature compensation of the oscillation circuit 22 in common with the portable telephone, thereby achieving reduction in size and cost of the portable telephone.

In a portable telephone which incorporates the conventional digital temperature-compensated crystal oscillator arranged as shown in FIG. 1, the controlled object is the output frequency of the oscillation circuit, whereas, in the portable telephone shown in FIG. 4, the controlled object is the output frequency at the antenna 9. Therefore, it is possible to realize even more accurate control than in the conventional system.

Further, in the above-described conventional portable telephone, temperature compensation is made in accordance with the temperature characteristic of a crystal resonator used therein. Therefore, when the crystal resonator, i.e. the oscillation circuit 22, has broken down, not the oscillation circuit 22 alone but the whole digital temperature-compensated crystal oscillator, arranged as shown in FIG. 1, must be replaced, whereas, in the portable telephone shown in FIG. 4, only the broken oscillation circuit 22 is necessary to replace.

Figure 5:
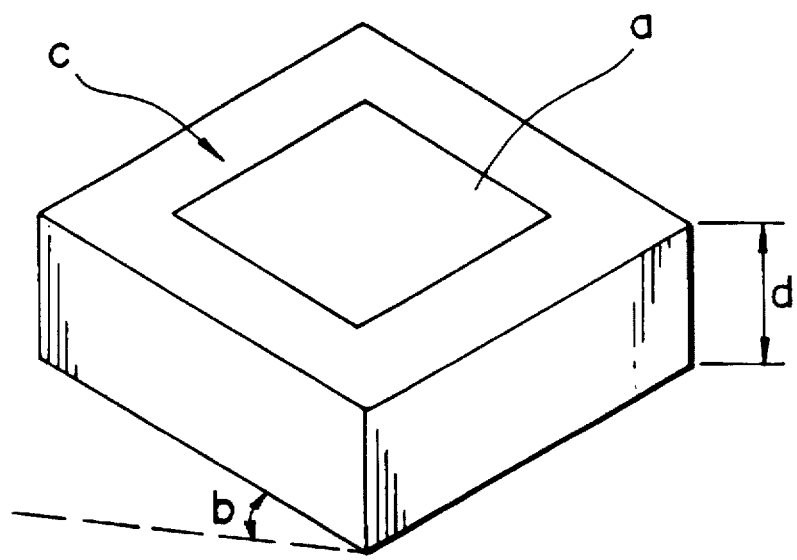
FIG. 5 shows the structure of an AT cut crystal plate.

As has been described above, a crystal resonator is used in the oscillation circuit of a portable telephone. A crystal plate cut for use as a crystal resonator also has the temperature characteristic that the oscillation frequency changes with variations in temperature. The temperature characteristics of crystal plates differ according to the manner in which the crystal plates are cut, i.e. AT cut, SC cut, and CT cut. FIG. 5 shows the structure of an AT cut crystal plate. As illustrated in the figure, the crystal resonator has electrodes a provided on both sides thereof. The natural frequency of the crystal resonator is determined by the material and configuration c, the cutting angle b, and the thickness d.

Figure 6:
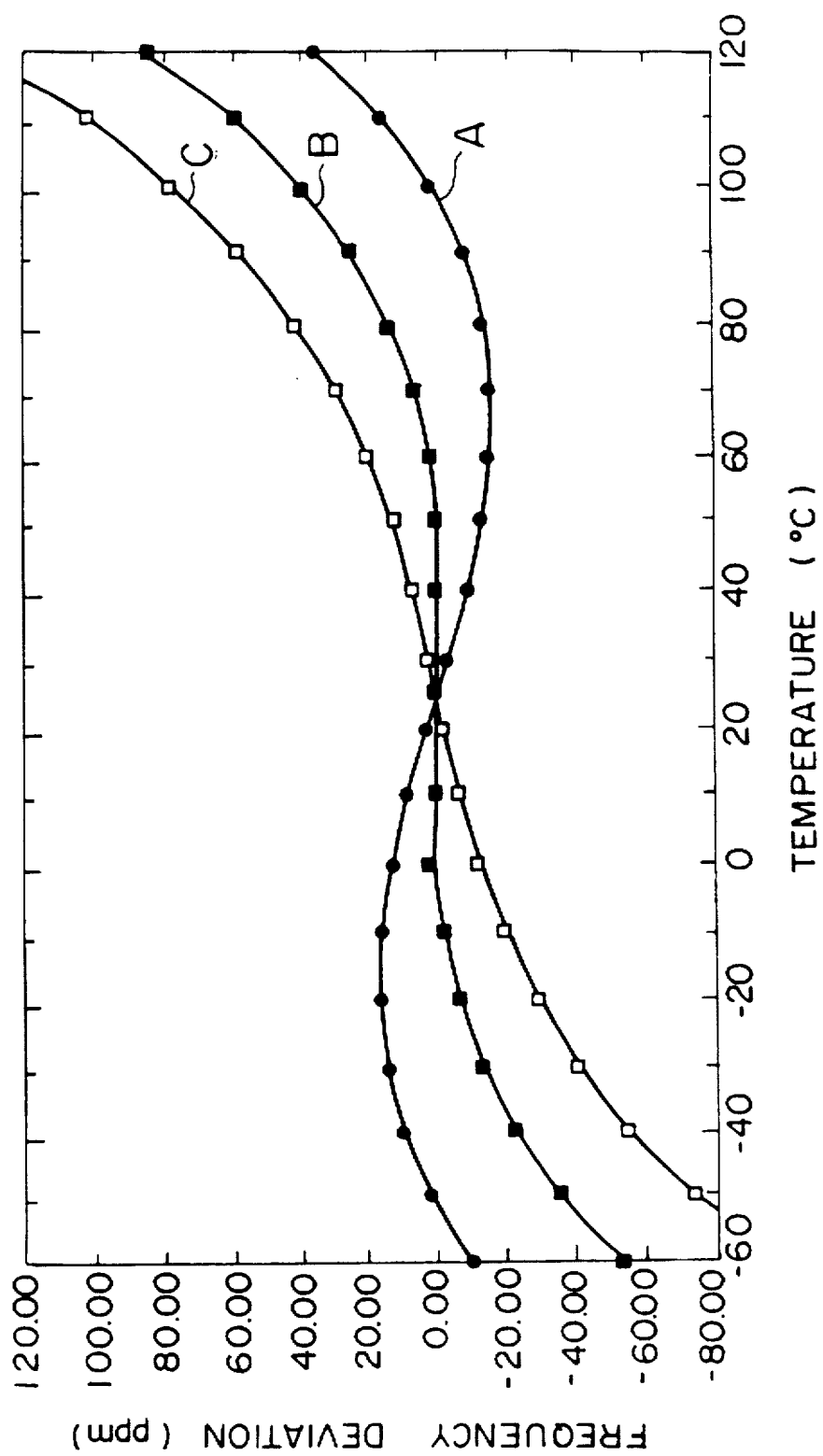
FIG. 6 shows the frequency deviation-temperature characteristics of AT cut crystal resonators with which the present invention is concerned.

FIG. 6 shows frequency deviation-temperature characteristics of AT cut crystal resonators. As illustrated in the figure, the crystal resonator having the characteristic B exhibits a very good characteristic in the temperature range of from −10° C. to +60° C., whereas the crystal resonator having the characteristic A shows smaller frequency variations in the temperature range of from −50° C. to +100° C. than the other two crystal resonators. Accordingly, a crystal resonator having an appropriate characteristic is used according to the use application and the working temperature range.

As shown in FIG. 6, the frequency deviation Δf/f (ppm) of an AT cut crystal resonator is generally given by the following polynomial:

$$\Delta f/f = A_0 + A_1 T + A_2 T^2 + A_3 T^3 + A_4 T^4 + A_5 T^5 + \quad (1)$$

where Δf is a frequency deviation, f is an oscillation frequency, $A_0$ to $A_n$ are coefficients, and T is a temperature.

In actual calculation of the above expression (1), the terms higher than third order are ignored because they are sufficiently small, and a frequency deviation can be calculated with sufficiently high accuracy by the following cubic expression with respect to temperature:

$$\Delta f/f = A_0 + A_1 T + A_2 T^2 + A_3 T^3 \quad (2)$$

Accordingly, for the frequency control, the constant $A_0$ and coefficients $A_1$, $A_2$ and $A_3$ of the crystal resonator are previously obtained. During the oscillation operation, the temperature of the crystal resonator is detected, and the expression (2) is calculated to obtain a frequency deviation $\Delta f/f$. Then, the frequency deviation is corrected by the crystal oscillation circuit shown in FIG. 2. By doing so, a constant frequency can be maintained.

The crystal resonator 45 has the temperature characteristic that the resonance frequency changes (on the order of ±10 ppm) with variations in temperature, as has been described above. The variable-capacitance diode 42 is a device whose electrostatic capacity changes with the control voltage applied thereto. A characteristic curve showing the relationship between the control voltage applied to the variable-capacitance diode 42 and the change of the output frequency is previously obtained by measurement. When the temperature of the crystal resonator 45 has changed during the oscillating operation of the oscillation circuit, a control unit (not shown) calculates a frequency deviation by the expression (2), and controls the voltage applied to the input terminal (see FIG. 2) so as to correct the frequency deviation, thereby controlling the output frequency at a constant level.

The conventional oscillation frequency control needs to previously obtain and store the constant $A_0$ and coefficients $A_1$, $A_2$ and $A_3$ of the crystal resonator and the characteristic of the variable-capacitance diode 42. Accordingly, it has heretofore been necessary to obtain the coefficients $A_0$, $A_1$, $A_2$ and $A_3$ of each crystal resonator from data measured at four or more measuring points in advance. It should be noted that the constant $A_0$ in the expression (2) is practically determined by the thickness d of the crystal plate (see FIG. 3), and that the coefficient $A_1$ is determined by the cutting angle b, and further that the coefficients $A_2$ and $A_3$ are practically determined by the material and configuration c.

However, the above-described AT cut crystal resonator differs in temperature characteristic according to the specifications; the constant $A_0$ and coefficients $A_1$, $A_2$ and $A_3$ differ for each crystal resonator. Further, it is necessary in order to obtain four values for the constant $A_0$ and coefficients $A_1$, $A_2$ and $A_3$ to prepare data measured at four or more measuring points for each crystal resonator. Preparation of such measured data requires a complicated operation and causes an increase in the number of manhours and a rise in cost. Moreover, the working efficiency is inferior, and the incidence of errors increases.

Accordingly, in this embodiment an efficient crystal resonator oscillation frequency calculating method is provided in which the number of measuring points required to measure a temperature characteristic of a crystal resonator is reduced.

The crystal resonator oscillation frequency calculating method will be explained below in detail. Variations in values for the constant $A_0$ and coefficients $A_1$, $A_2$ and $A_3$ of AT cut crystal resonators made of the same material and produced by the same production process fall within a relatively narrow range. For example, variations in values for the coefficient $A_3$ fall within ±8%. The variations may be said to be manufacturing errors introduced during the production of AT cut crystal resonators.

Figure 7:
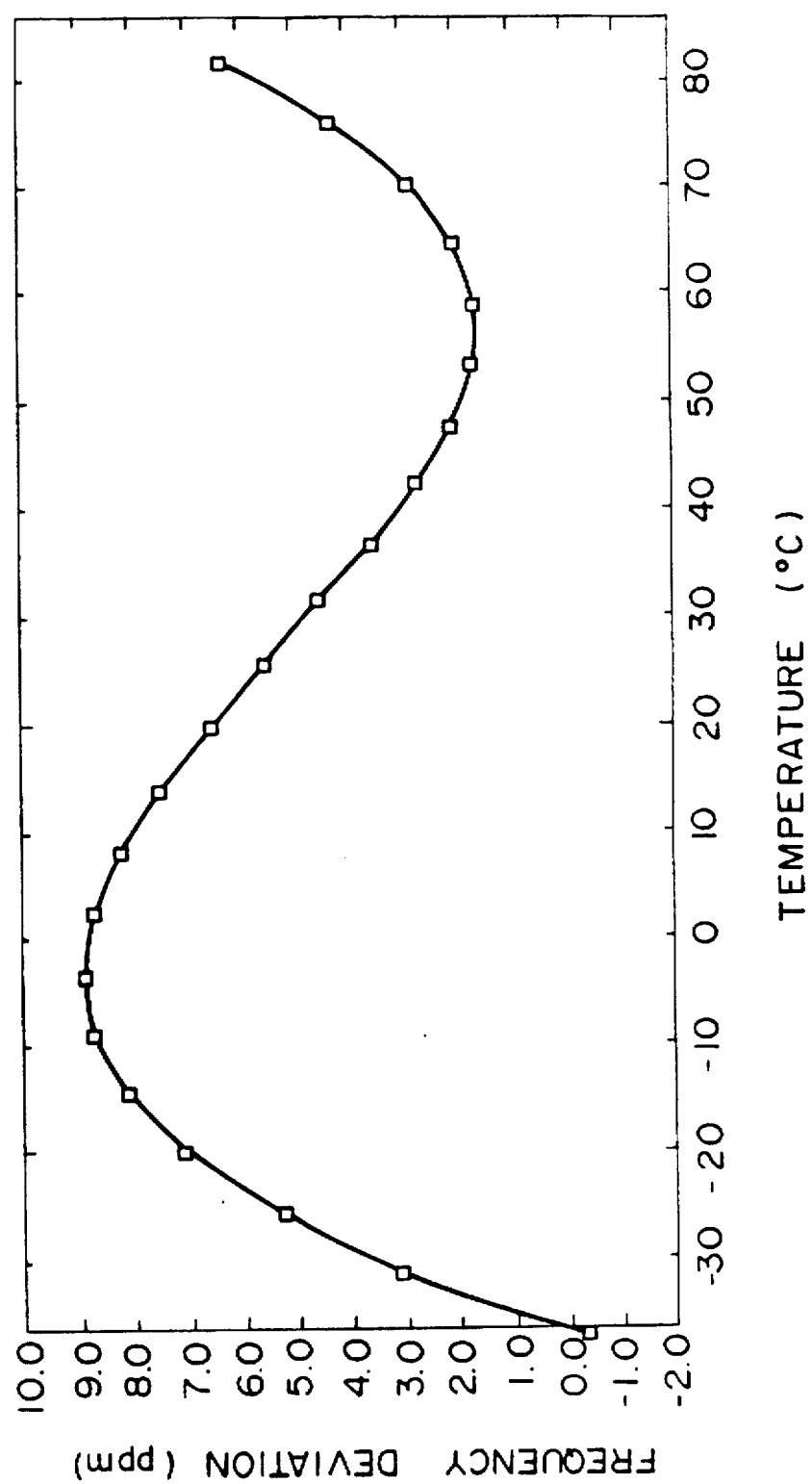
FIG. 7 shows a characteristic curve obtained from data measured at three measuring points with coefficient $A_3$ fixed, together with measured values.

FIG. 7 shows a characteristic curve obtained from data measured at three measuring points by the oscillation frequency calculating method according to the present invention by using a mean value as the coefficient $A_3$. FIG. 7 also shows measured values. The characteristic curve shown in FIG. 7 was obtained as follows: With the coefficient $A_3$ fixed at a mean value ($A_3 = -0.15/10^5$) obtained by calculation, frequencies were measured at three temperature points of $-20°$ C., $20°$ C. and $60°$ C., respectively, and the constant $A_3$ and coefficients $A_1$ and $A_2$ were obtained from the following expression (3), thereby calculating a characteristic curve:

$$Y_1 = A_0 + A_1 T_1 + A_2 T_1^2 + A_3 T_1^3$$
$$Y_2 = A_0 + A_1 T_2 + A_2 T_2^2 + A_3 T_2^3 \quad (3)$$
$$Y_3 = A_0 + A_1 T_3 + A_2 T_3^2 + A_3 T_3^3$$

where $T_1$: a measuring temperature of $-20°$ C.

$T_2$: a measuring temperature of $20°$ C.

$T_3$: a measuring temperature of $60°$ C.

$Y_1$: a frequency deviation measured at $-20°$ C.

$Y_2$: a frequency deviation measured at $20°$ C.

$Y_3$: a frequency deviation measured at $60°$ C.

As will be understood from FIG. 7, if an appropriate value is selected as the coefficient $A_3$, a frequency deviation can be calculated to be accurate to within 0.1 ppm.

The measuring temperatures are not necessarily limited to the three points of $-20°$ C., $20°$ C. and $60°$ C. If appropriate values are selected in the range of from $-20°$ C. to $75°$ C., a frequency deviation can be calculated to be accurate to within 0.1 ppm with respect to the measured value (not shown) in the same way as the above.

The cubic curve representing the temperature characteristic of the AT cut crystal resonator is centered at approximately $25°$ C. (point of inflection). The reason for this is to make the characteristic at and near room temperatures as smooth as possible. Consequently, frequency variations are relatively large at high and low temperatures. Therefore, it is preferable to select measuring temperatures at higher and lower levels in the working temperature range (of portable telephones). By doing so, frequency variations become uniform as a whole, and thus favorable results are obtained.

Figure 8:
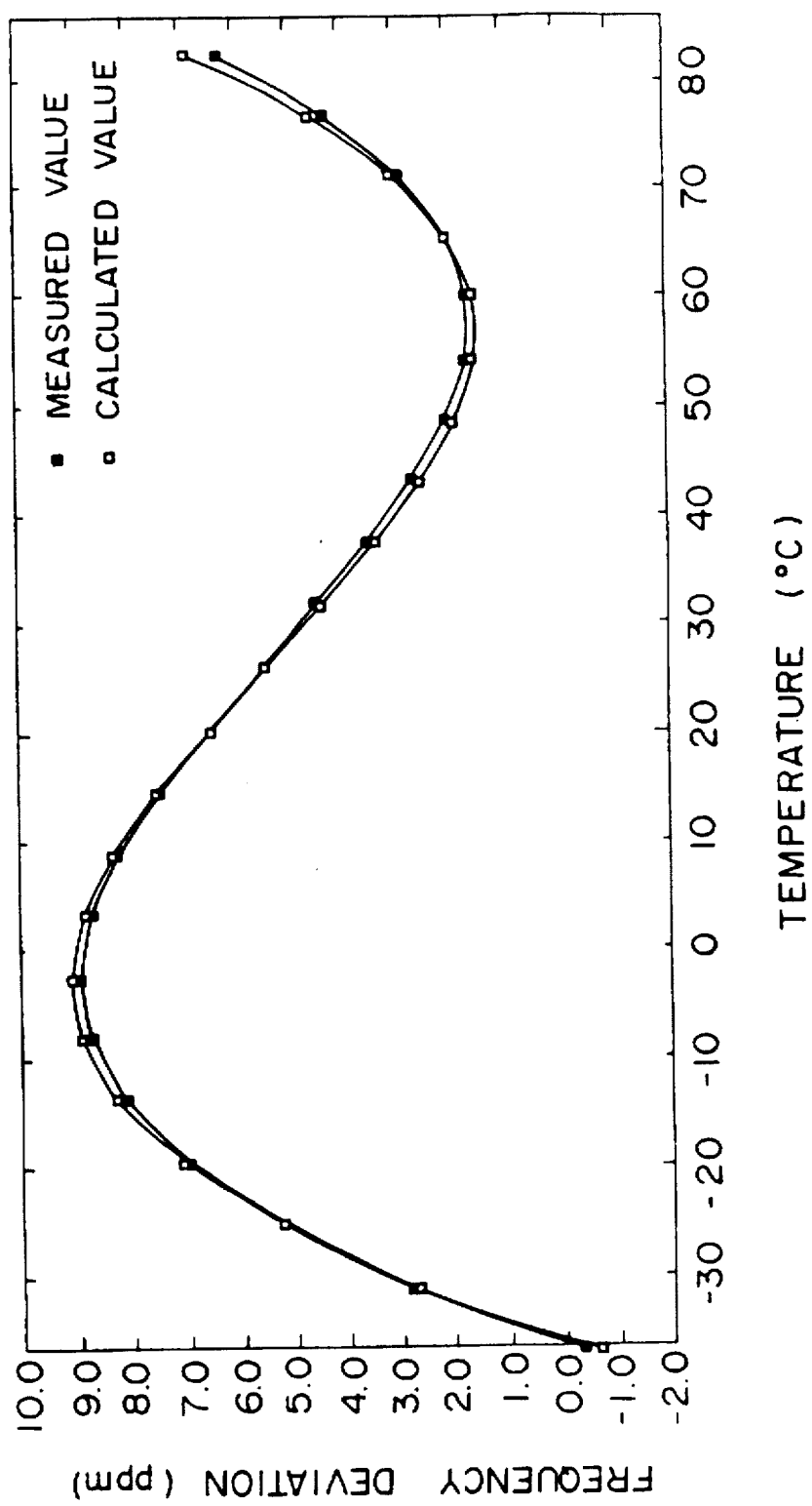
FIG. 8 shows calculated values and measured values, which were obtained when coefficient $A_3$ was changed by $-8\%$.

Crystal resonators have the same value for the coefficient $A_3$ if there is no manufacturing error. However, the result of measuring a large number of existing AT cut crystal resonators reveals that there are manufacturing errors of ±8% even if the specifications are the same. FIG. 8 shows calculated values and measured values, which were obtained when the coefficient $A_3$ was changed from the mean value by −8%.

The calculated values in FIG. 8 were obtained by determining the coefficients $A_0$, $A_1$ and $A_2$ from the expression (3) and thus calculating a frequency deviation characteristic curve. As will be understood from FIG. 8, a frequency deviation can be calculated with an error of 0.2 ppm in the measuring temperature range of from $-20°$ C. to $60°$ C. With respect to temperatures outside that temperature range, a frequency deviation can be calculated with an error of 0.35 ppm at the point of $-30°$ C., with an error of 0.35 ppm at the point of $70°$ C., and with an error of about 0.6 ppm at the point of $75°$ C.

In another experiment, with the value of the coefficient $A_3$ increased by ±8% from the mean value, frequencies were measured at three temperature points which were $20°$ C. apart in the range of from $-20°$ C. to $75°$ C., and the coefficients $A_0$, $A_1$ and $A_2$ were obtained to calculate frequency deviations. In this case also, results similar to those described above were obtained. These results satisfactorily meet the requirements that the frequency deviation shall be within ±1 ppm in the temperature range of from −20° C. to 60° C., as specified by RCR-STD (RCR Standards).

As has been described above, by using a mean value as a value for the coefficient $A_3$ of a crystal resonator, a frequency deviation can be readily calculated by obtaining the other coefficients $A_0$, $A_1$, and $A_2$ from data measured at three measuring points. Although in the foregoing description a mean value is used as a value for the coefficient $A_3$ of a crystal resonator, it should be noted that, it is also possible to use a mean value as a value for the coefficient $A_2$ and to obtain the other coefficients $A_0$, $A_1$ and $A_3$ from data measured at three measuring points. Alternatively, it is also possible to use a mean value as a value for each of the coefficients $A_2$ and $A_3$ of a crystal resonator and to obtain the constant $A_0$ and the coefficient $A_1$ from data measured at two measuring points.

Next, a specific example of calculating a frequency deviation will be explained. A frequency deviation is calculated in order to obtain a control voltage (correction voltage) to be applied to the input terminal $T_{in}$ of the crystal oscillation circuit shown in FIG. 2; generally, it is calculated by a processing unit (CPU). When the temperature of the crystal resonator 45 has changed during the oscillating operation of the crystal oscillation circuit, the processing unit (CPU) receives information from the temperature sensor, and calculates a frequency deviation by the cubic expression ($A_0 + A_1T + A_2T^2 + A_3T^3$) shown by Eq. (2). In order to reduce the computing time required for the calculation, each coefficient is multiplied by $10_n$, and the resulting product is rounded off to the first decimal place, thereby converting the coefficient into a value of integer type. This integer coefficient is stored in the memory in advance. When a frequency deviation is to be calculated, the processing unit (CPU) divides the integer coefficient by $10_n$, thereby preventing an error from being introduced into the result of the calculation. By doing so, the computing time can be reduced to $\frac{1}{15}$ of that in the case of floating-point calculation, and thus the processing time can be reduced to a considerable extent.

In this embodiment, the number of items of measured data can be reduced by using mean values for some of n coefficients. For example, if a mean value is used as the third-degree coefficient, a frequency deviation value can be calculated with sufficiently high accuracy by obtaining each coefficient from data measured at three measuring points, although data measured at four measuring points has heretofore been needed to obtain the third-, second- and first-degree coefficients and the constant and to thereby calculate an oscillation frequency deviation value.

If a mean value is used as each of the third- and second-degree coefficients, a frequency deviation value can be calculated with sufficiently high accuracy by obtaining each coefficient from data measured at two measuring points. Accordingly, it is possible to reduce the number of manhours and the cost as a result of the reduction in the number of points for measuring data.

Next, a method of correcting the frequency of a digital control type oscillation circuit of a portable telephone according to the present invention will be explained.

Figure 9:
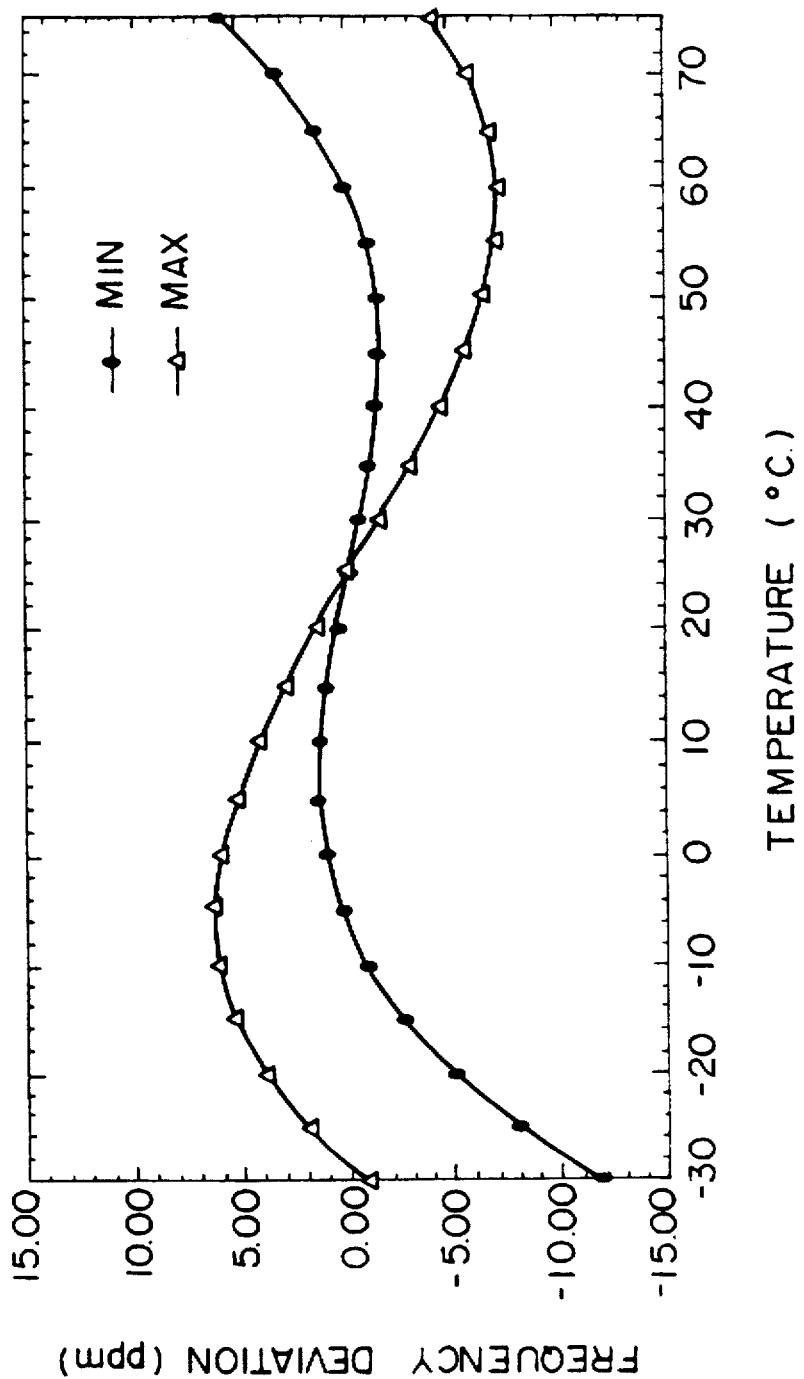
FIG. 9 shows temperature characteristics of crystal resonators.

FIG. 9 shows temperature characteristics of crystal resonators. As will be understood from the figure, crystal resonators vary from each other in temperature characteristics. FIG. 9 shows the temperature characteristics of crystal resonators whose resonance frequencies change in the range of from −12 ppm to +7 ppm at the maximum relative to a reference frequency when the temperature is changed in the range of from −30° C. to 75° C. with 25° C. defined as a center. In order to correct the frequency deviation of a crystal resonator, the control voltage applied to the variable-capacitance diode 42 is adjusted by the oscillation circuit in FIG. 2.

Figure 3:
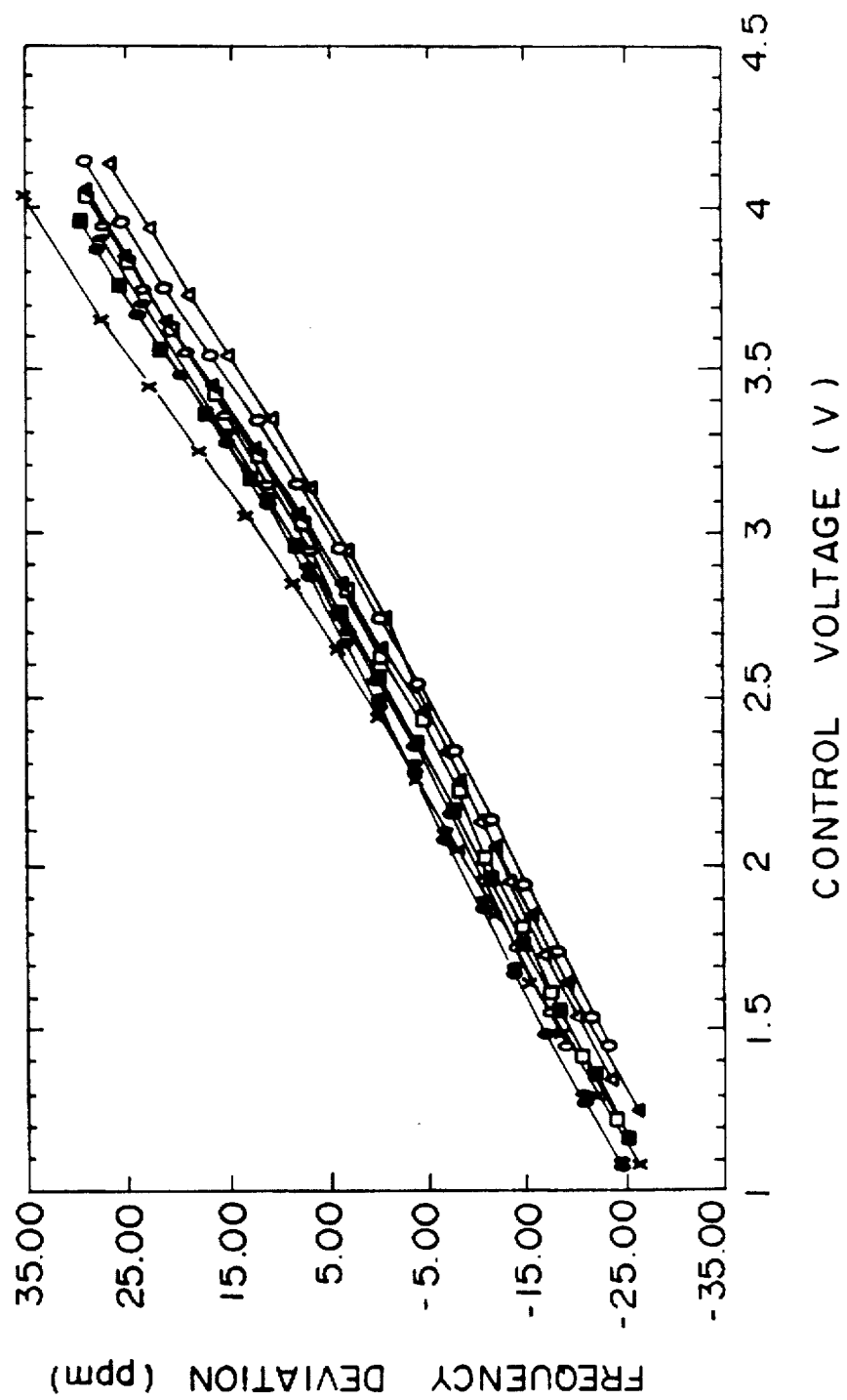
FIG. 3 shows control voltage-frequency deviation characteristics of various variable-capacitance diodes.

The control voltage ($V_{cont}$)-frequency deviation characteristic of a variable-capacitance diode is expressed by an approximately linear expression with respect to control voltage as shown in FIG. 3. The slope of the control voltage-frequency deviation characteristic of the variable-capacitance diode 42 is assumed to be K.

Accordingly, a frequency deviation can be corrected by applying a control voltage (correction voltage) $V_i$ given by $$V_i = V_0 - \Delta f_i \cdot K \tag{4}$$

where $V_0$ is a control voltage when the frequency deviation is zero, $\Delta f_i$ is a frequency deviation at each temperature, $V_i$ is a control voltage (correction voltage) to be applied at each particular temperature, and K is the slope of the variable-capacitance diode 42.

Figure 2:
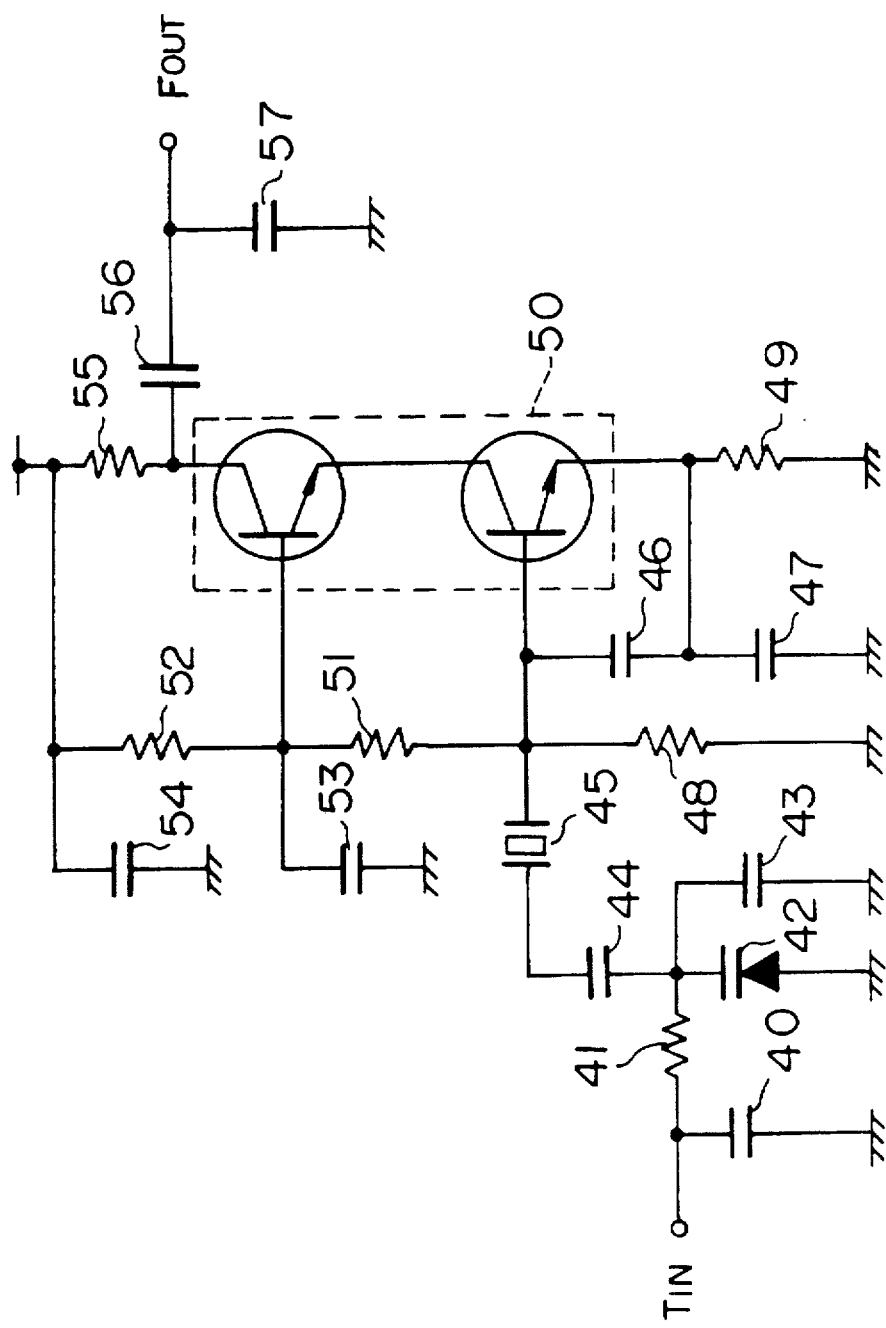
FIG. 2 shows the arrangement of an oscillation circuit which uses a crystal resonator.

The conventional frequency correcting method has heretofore been carried out as follows: As shown in FIGS. 1 and 2, the memory 67 has been previously stored with the temperature characteristic (the relation between the temperature change and the frequency deviation $\Delta f_i$, or a reference table concerning the temperature characteristic) of the crystal resonator 45, together with the value of the slope K of the variable-capacitance diode 42. The CPU 64 calculates a control voltage (correction voltage) $V_i$ by the linear expression (4) according to the temperature detected with the temperature sensor 62, and applies the calculated control voltage $V_i$ to the variable-capacitance diode 42, thereby correcting a drift of the output frequency.

Figure 22:
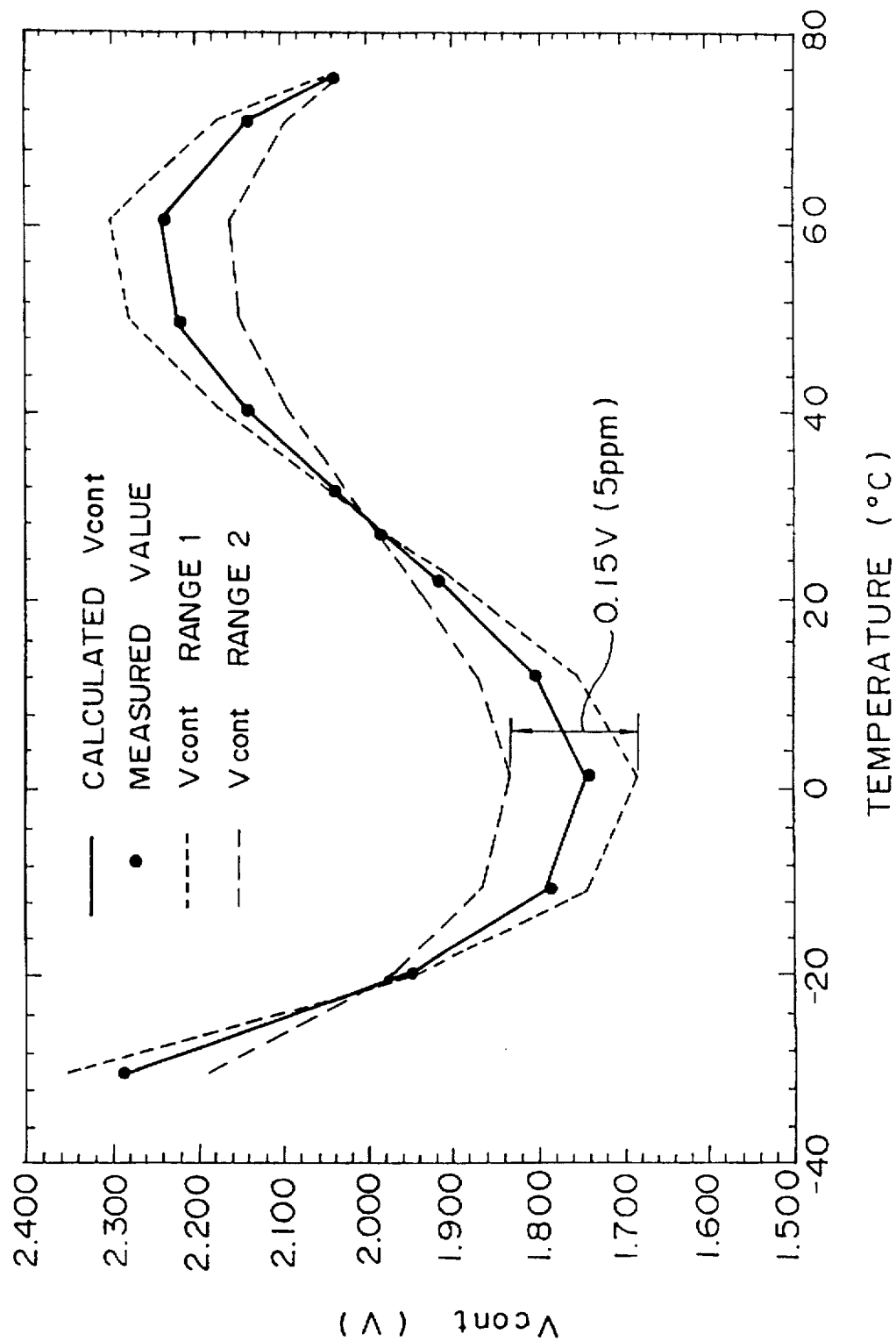
FIG. 22 shows temperature characteristics obtained by a conventional frequency correcting method.

However, the slope K of the variable-capacitance diode 42 varies from that of another, as shown in FIG. 3. The conventional practice is to select a variable-capacitance diode having a slope close to a predetermined slope K and to store the value thereof in the memory 67 as the slope K of the variable-capacitance diode 42 in advance. Accordingly, the conventional practice has the problem that it is not possible to use any variable-capacitance diode but one which has the slope K. Moreover, an error is introduced into the control voltage (correction voltage) $V_i$ because the slope of the control voltage-frequency deviation characteristic is not accurate. As shown for example in FIG. 22, variations in the slope K cause the control voltage to have a maximum error of about 0.15 V, i.e. a maximum error of about 5 ppm in terms of the frequency deviation.

Further, the slopes K of the straight lines representing control voltage-frequency deviation characteristics of variable-capacitance diodes as shown in FIG. 3 are not uniform over the entire control voltage range; the control voltage-frequency deviation characteristic of each variable-capacitance diode is given by an approximately linear expression. Accordingly, an error arises unless correction is made using a control voltage (correction voltage) $V_i$ which is given by a linear expression with a slope K obtained in an appropriate control voltage range. These errors, considered together with other error factors of the crystal resonator 45, exceed 1 ppm and do not meet the requirements that the frequency deviation shall be within ±1 ppm in the temperature range of from −20° C. to 60° C., as specified by RCR-STD (RCR Standards).

Therefore, in the present invention, a linear expression representing the relationship between the frequency deviation and the control voltage is obtained for each variable-capacitance diode to be used for temperature compensation, and the control voltage is controlled according to the linear expression, thereby achieving an improvement in the accuracy of the frequency. The arrangement of a digital temperature-compensated crystal oscillator, to which the frequency correcting method according to the present invention is applied, and the oscillation circuit are the same as those shown in FIGS. 1 and 2; therefore, description thereof is omitted.

Figure 10:
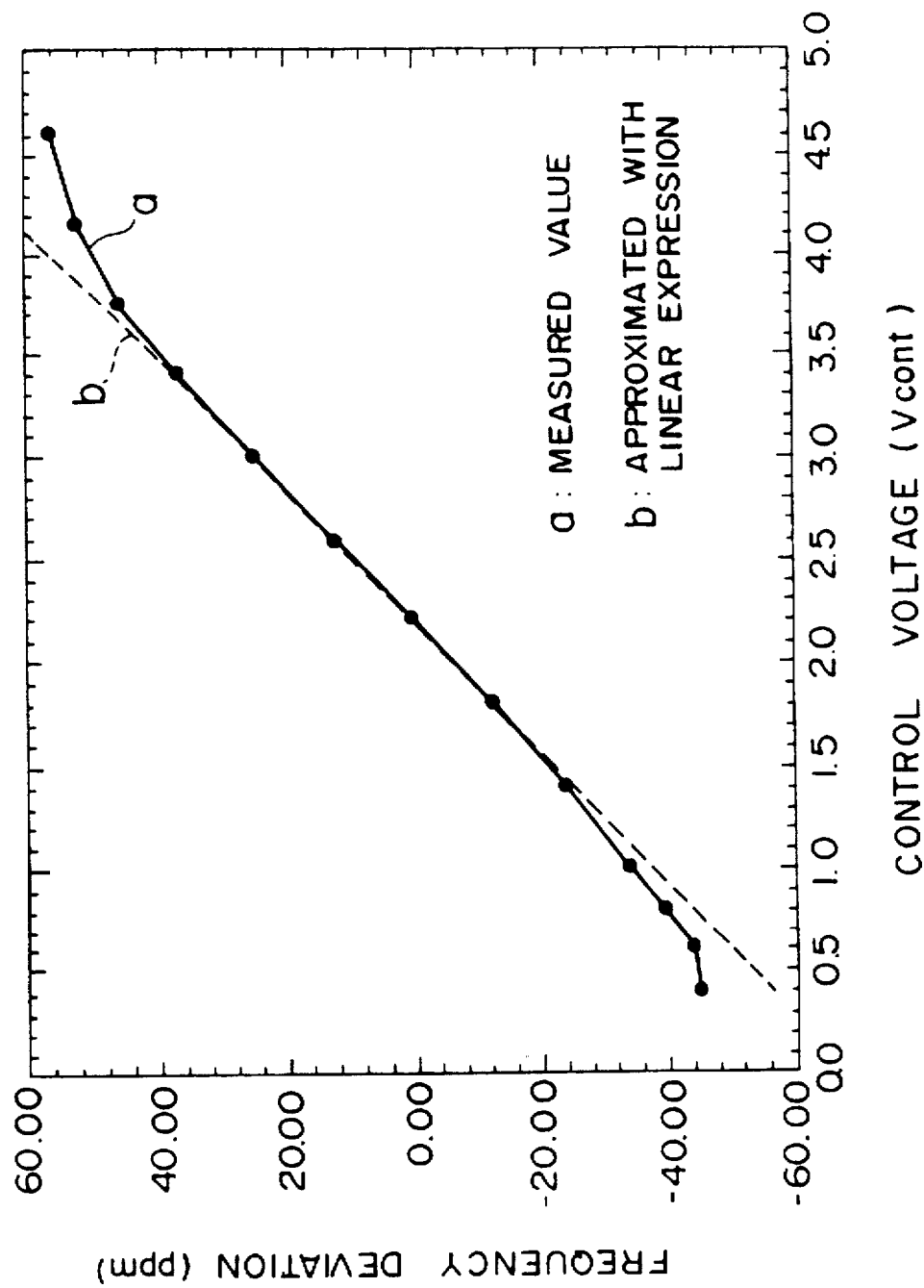
FIG. 10 shows the characteristic of a variable-capacitance diode used in a frequency correcting method according to the present invention.

FIG. 10 shows the characteristic of a variable-capacitance diode used in the frequency correcting method according to the present invention. As shown by the graph of the measured values a in the figure, the characteristic of the variable-capacitance diode 42 becomes nonlinear as the distance from the center increases. In this embodiment, however, the slope K of the variable-capacitance diode 42 is approximated with a straight line b including the point at which the frequency deviation is zero. The slope K is given by $$K=(V-V_0)/\Delta f \tag{5}$$

where $V_0$ is a control voltage when the frequency deviation is zero, V is a control voltage, and $\Delta f$ is a frequency deviation at the control voltage V.

A control voltage (correction voltage) to be applied to the variable-capacitance diode 42 is calculated by the above expression (4) ($V_i=V_0-\Delta f_i \cdot K$), and the calculated control voltage is applied to the variable-capacitance diode 42.

The crystal resonator 45 exhibits a temperature characteristic such as that shown in FIG. 9, which is generally given by a cubic expression with respect to temperature. The slope K of the variable-capacitance diode 42 and the temperature characteristic (cubic expression) of the crystal resonator 45 are previously stored in the memory 67. The CPU 64 calculates a frequency deviation from the temperature detected with the temperature sensor 62 and the temperature characteristic of the crystal resonator 45. Then, the CPU 64 calculates a control voltage by the expression (4) using the slope K of the variable-capacitance diode 42, and applies the calculated control voltage to the variable-capacitance diode 42.

Figure 11:
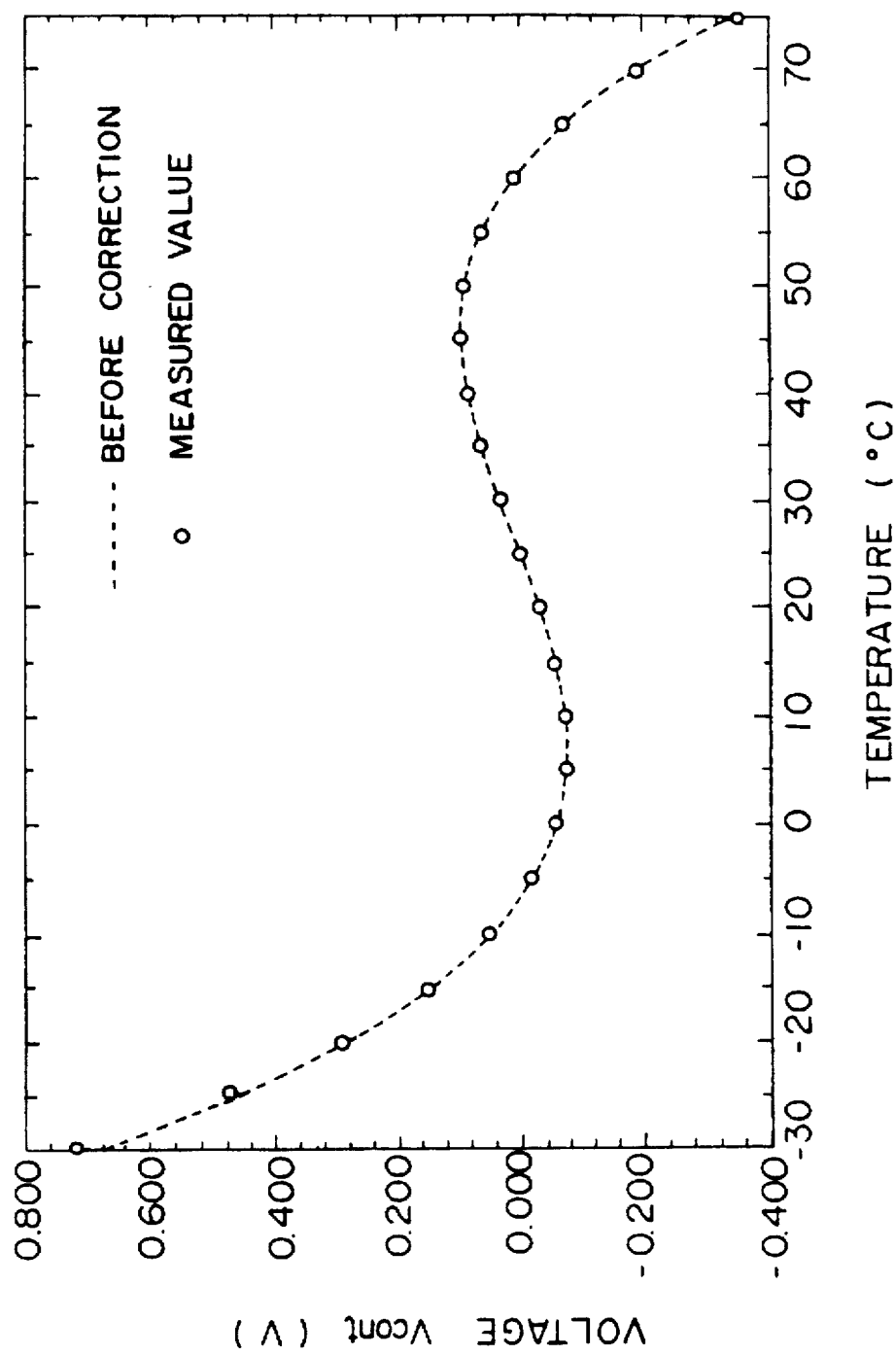
FIG. 11 shows the control voltage relative to the temperature obtained by a frequency correcting method according to the present invention.

FIG. 11 shows the way in which the control voltage ($V_{cont}$) is changed relative to the temperature by the frequency correcting method according to the present invention. In the case of using a variable-capacitance diode having an approximately linear control voltage-frequency deviation characteristic as shown in FIG. 3 and a crystal resonator having a temperature characteristic such as that shown by MIN in FIG. 9, the frequency deviation (error) can be kept within 0.6 ppm by changing the control voltage relative to the temperature as shown in FIG. 11.

Figure 12:
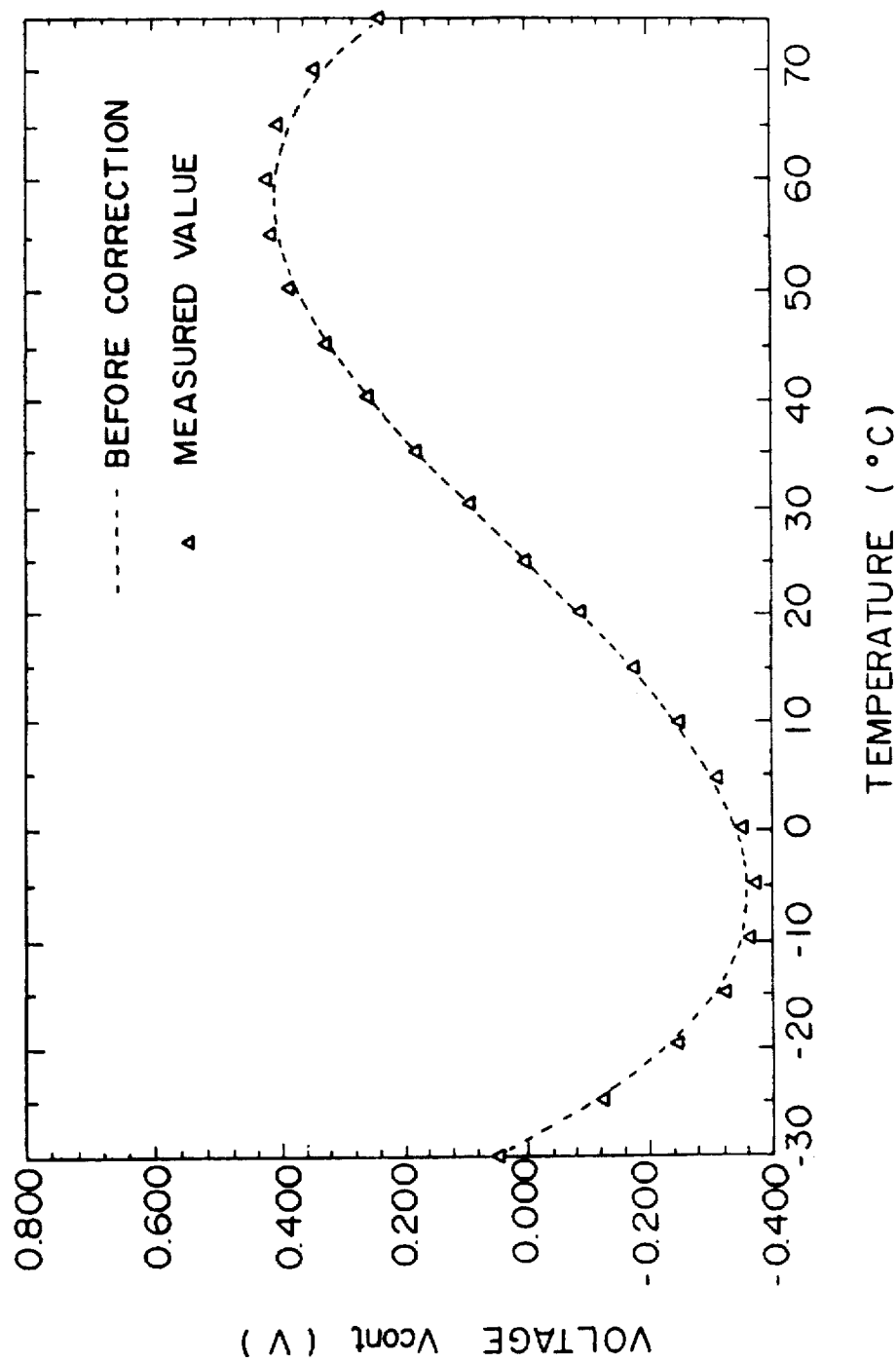
FIG. 12 shows the control voltage relative to the temperature obtained by a frequency correcting method according to the present invention.

FIG. 12 also shows the way in which the control voltage ($V_{cont}$) is changed relative to the temperature by the frequency correcting method according to the present invention. In the case of using a variable-capacitance diode having an approximately linear control voltage-frequency deviation characteristic as shown in FIG. 3 and a crystal resonator having a temperature characteristic such as that shown by MAX in FIG. 9, the frequency deviation (error) can also be kept within 0.5 ppm by changing the control voltage relative to the temperature as shown in FIGS. 11 and 12.

Thus, according to the method of the present invention, a frequency deviation characteristic with respect to the control voltage is expressed by a linear expression for a linear portion including a point at which the frequency deviation is zero for each variable-capacitance diode 42 to be used, and a slope K is set on the basis of measured values. Therefore, there is no error due to variations as in the conventional practice, and it becomes possible to effect accurate frequency control.

Further, because the control voltage-frequency deviation characteristic is represented by a signal straight line over the entire control range, the measurement is facilitated, and there is no need for a selecting operation which has heretofore been needed. It should be noted that an optimum voltage range for favorably obtaining the slope K is from 1.8 V to 3.5 V.

Further, according to the method of the present invention, frequency correction can be realized simply by storing the necessary coefficients in the memory using the conventional hardware as it is. Therefore, no extra cost is required. Furthermore, because no feedback control is used, the control operation is rapidly stabilized. Therefore, the present invention is most suitable for use as a frequency correcting method for portable telephones.

Next, another method of correcting the frequency of a digital control type oscillation circuit of a portable telephone according to the present invention will be explained.

As described above, crystal resonators have the temperature characteristic that the resonance frequency changes (on the order of ±10 ppm) with variations in temperature, and the variable-capacitance diode 42 is a device whose electrostatic capacity changes with the control voltage applied thereto. Accordingly, when the temperature of the crystal resonator 45 has changed, the CPU 64 (see FIG. 1) controls the electrostatic capacity of the variable-capacitance diode 42 by controlling the voltage applied to the variable-capacitance diode 42 of the oscillation circuit 61 (see FIG. 2). By doing so, it is possible to control the output frequency (oscillation frequency) at a constant level.

Figure 13:
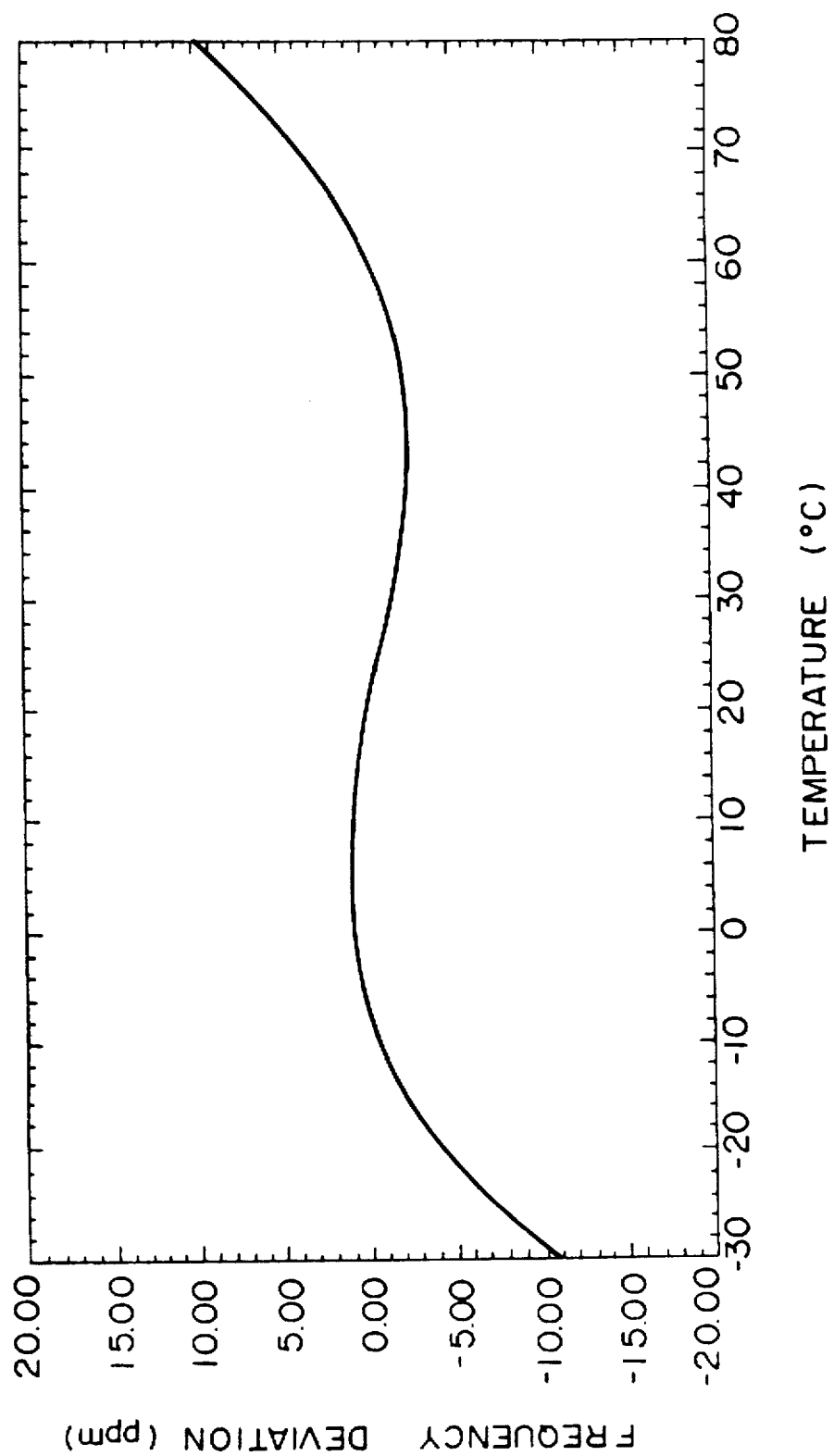
FIG. 13 shows the temperature characteristic of a crystal resonator.
Figure 14:
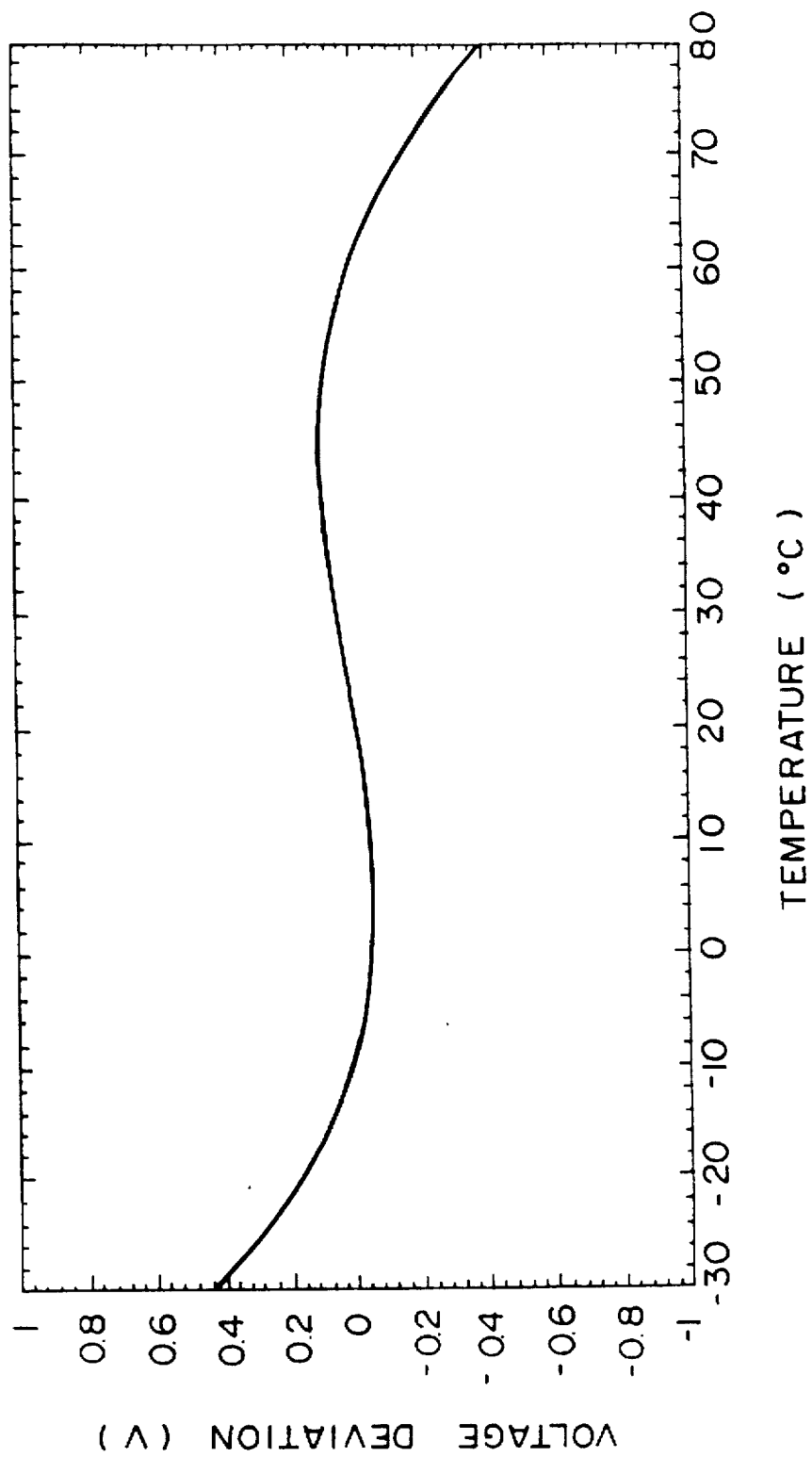
FIG. 14 shows a correction curve for correcting a frequency deviation caused by a temperature change.

FIG. 13 shows an example of the resonance frequency-temperature characteristic of a crystal resonator. The axis of ordinate represents the deviation of the resonance frequency from a reference frequency. Generally, the resonance frequency-temperature characteristic can be approximately represented by a cubic expression. FIG. 14 shows a correction curve for correcting a frequency deviation caused by a temperature change. The axis of abscissa represents the temperature, and the axis of ordinate represents the deviation of the control voltage, which is applied to the variable-capacitance diode 42, from a reference control voltage. The graph of FIG. 14 shows that a control voltage deviation corresponding to a temperature is input to the input terminal $T_{in}$ (see FIG. 2) so as to correct the output frequency at the output terminal $T_{out}$, thereby maintaining the output frequency at a constant level.

Figure 15:
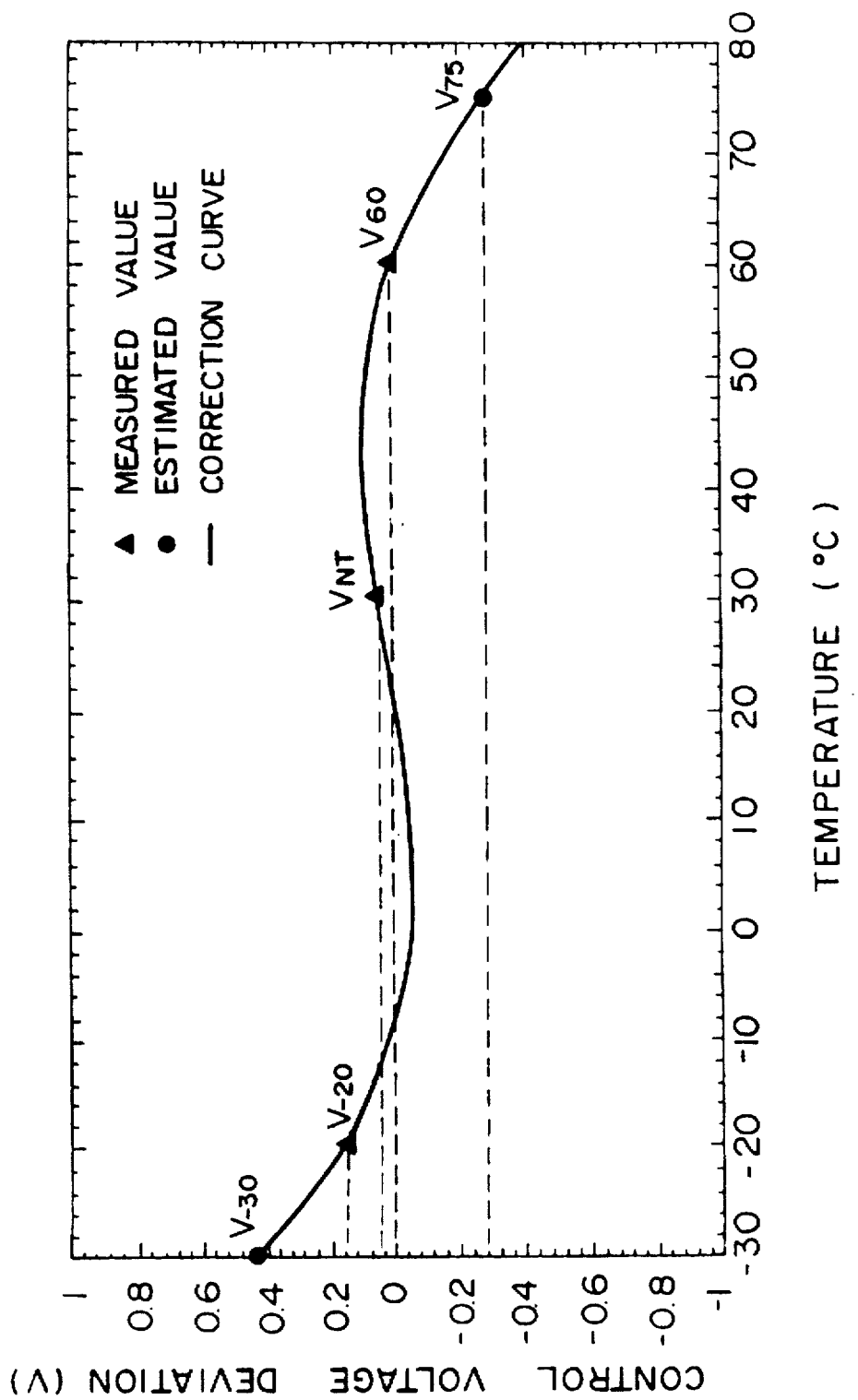
FIG. 15 shows an example in which estimated values are obtained values measured at three measuring points, and a cubic correction curve is obtained from these values.

Crystal resonators which may be used as the crystal resonator 45 in FIG. 2 differ from each other in temperature characteristics. Therefore, the frequency deviation must be corrected for each crystal resonator. FIG. 15 shows an example in which a cubic correction curve is determined by obtaining estimated values from values measured at three points. The frequency correcting method will be explained below with reference to FIG. 15.

(1) Input terminal voltage (control voltage applied to the variable-capacitance diode 42) at which a predetermined output frequency is obtained is measured at each of measuring temperature points of −20° C., room temperature (10° C. to 35° C.) and 60° C. The measured input terminal voltages are assumed to be $V_{-20}$, $V_{NT}$ and $V_{60}$, respectively. Subsequently, the steps (2) to (4) are carried out. For these steps (2) to (4), three different methods are available, which will be shown in the following paragraphs A, B and C.

A. (2) The differences $V_{-20-NT}$ and $V_{60-NT}$ are determined:

$$V_{-20-NT}=V_{-20}-V_{NT} \qquad ①$$

$$V_{60-NT}=V_{60}-V_{NT} \qquad ②$$

(3) Values for $V_{-30\text{-}NT}$ and $V_{75\text{-}NT}$ are estimated according to a linear multiple regression model by using the differences $V_{-20\text{-}NT}$ and $V_{60\text{-}NT}$ obtained from Eqs. ① and ② as variables.

(4) $V_{NT}$ is added to the values for $V_{-30\text{-}NT}$ and $V_{75\text{-}NT}$ estimated at (3) to obtain values for $V_{-30}$ and $V_{75}$ (see the estimated values shown in FIG. 15).

$$V_{-30} = V_{-30\text{-}NT} + V_{NT} \qquad ③$$

$$V_{75} = V_{75\text{-}NT} + V_{NT} \qquad ④$$

B. (2) The ratios $V_{-20/NT}$ and $V_{60/NT}$ are determined:

$$V_{-20/NT} = V_{-20}/V_{NT} \qquad ①$$

$$V_{60/NT} = V_{60}/V_{NT} \qquad ②$$

(3) Values for $V_{-30/NT}$ and $V_{75/NT}$ are estimated according to a linear multiple regression model by using the ratios $V_{-20/NT}$ and $V_{60/NT}$ obtained from Eqs. ① and ② as variables.

(4) The values for $V_{-30/NT}$ and $V_{75/NT}$ estimated at (3) are multiplied by $V_{NT}$ to obtain values for $V_{-30}$ and $V_{75}$ (see the estimated values shown in FIG. 15).

$$V_{-30} = V_{-30/NT} \times V_{NT} \qquad ③$$

$$V_{75} = V_{75/NT} \times V_{NT} \qquad ④$$

C. (2) Values for $V_{-30/NT}$ and $V_{75/NT}$ are determined according to a linear multiple regression model by using $V_{-20}$, $V_{NT}$ and $V_{60}$ as variables (see the estimated values shown in FIG. 15).

There is no step (3) nor (4).

(5) A correction curve which is represented by a cubic expression is prepared by using the method of least squares from the measured input terminal voltages (control voltages to be applied to the variable-capacitance diode 42) $V_{-20}$, $V_{NT}$ and $V_{60}$ and the input terminal voltages $V_{-30}$ and $V_{75}$ obtained by the estimation using a linear multiple regression model. It should be noted that the ordinate axis of the graph shown in FIG. 15 represents the control voltage deviation. It should also be noted that, when values measured at four or more measuring points are used, the above-described step for obtaining estimated values is omitted.

Each coefficient (temperature coefficient) of the cubic correction curve obtained by the above-described method is previously stored in the storage circuit 67 shown in FIG. 1. The CPU 64 calculates the cubic expression on the basis of the temperature detected with the temperature sensor 62 and input thereto through the A/D converter 63 to obtain a control voltage deviation, and delivers the calculated control voltage deviation as an output signal. The output signal is converted into an analog value in the D/A converter 65, integrated in the integrating circuit 66, and input to the oscillation circuit 61. The input voltage is applied to the variable-capacitance diode 42 in the oscillation circuit 61 to control the output frequency (see FIG. 2).

Figure 16:
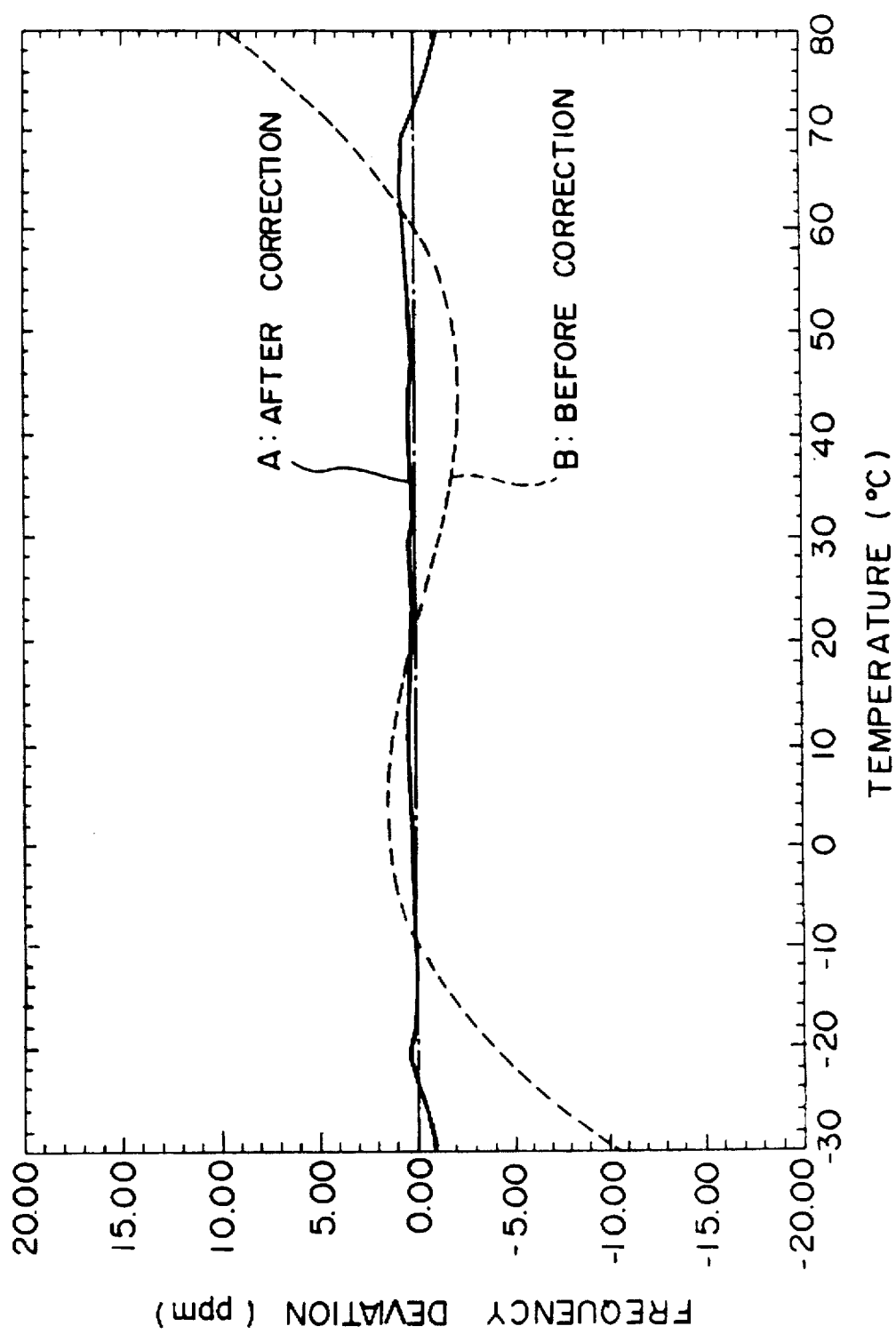
FIG. 16 shows frequency-temperature characteristics before and after frequency correction made by a control method according to the present invention.

FIG. 16 shows frequency-temperature characteristics before and after correction made by a control method according to the present invention. In the figure, the curve A (continuous line) represents the frequency-temperature characteristic after the correction, and the curve B (dashed line) represents the frequency-temperature characteristic before the correction. As will be clear from the figure, the control method according to this embodiment enables the output frequency to be controlled at an approximately constant level over a wide temperature range.

As has been described above, in the control method according to this embodiment, a correction curve is obtained simply by measuring data at a plurality of points, particularly at three points, for each oscillation circuit 61, and the coefficients (temperature coefficients) of the correction curve are obtained and stored in the storage circuit. Therefore, the required storage capacity is minimized, and the number of manhours is also reduced. Accordingly, it is possible to realize accurate temperature compensation at reduced cost.

Although in this embodiment, data is measured at three points of −20° C., room temperature (10° C. to 35° C.) and 60° C., it should be noted that any temperature points may be selected. However, two points are preferably selected from among those which are within temperature ranges of from −30° C. to −10° C. and of from 50° C. to 75° C., where a particularly large variation is observed.

In the control method according to this embodiment, a frequency deviation curve (correction curve) is calculated from data measured at a plurality of points, particularly at three points, and the coefficients (temperature coefficients) of the correction curve are stored in the storage circuit. Therefore, the required storage capacity is minimized, and the number of manhours is also reduced. Accordingly, it is possible to construct an oscillation circuit capable of accurate temperature compensation at reduced cost.

Further, although it has heretofore been difficult with the conventional technique to use a crystal resonator having a frequency-temperature characteristic which differs from a reference characteristic to a considerable extent, the present invention makes it possible to readily use even a crystal resonator having a frequency-temperature characteristic which differs from a reference characteristic to a considerable extent because a correction curve for each crystal resonator is directly obtained. Thus, the frequency control method is superior in flexibility to the conventional technique.

Even when the crystal resonator alone has been replaced with another, the correction curve can be readily corrected.

Next, still another method of correcting the frequency of a digital control type oscillation circuit of a portable telephone according to the present invention will be explained.

As shown in FIG. 3, variable-capacitance diodes vary in the slope K, and the conventional practice is to select a variable-capacitance diode 42 having a slope close to a predetermined slope K and to store the slope K in the memory 67 in advance. Accordingly, it takes a great deal of time to select a proper variable-capacitance diode. Moreover, an error is introduced into the control voltage (correction voltage) $V_i$ because the slope of the control voltage-frequency deviation characteristic is not accurate.

Figure 17:
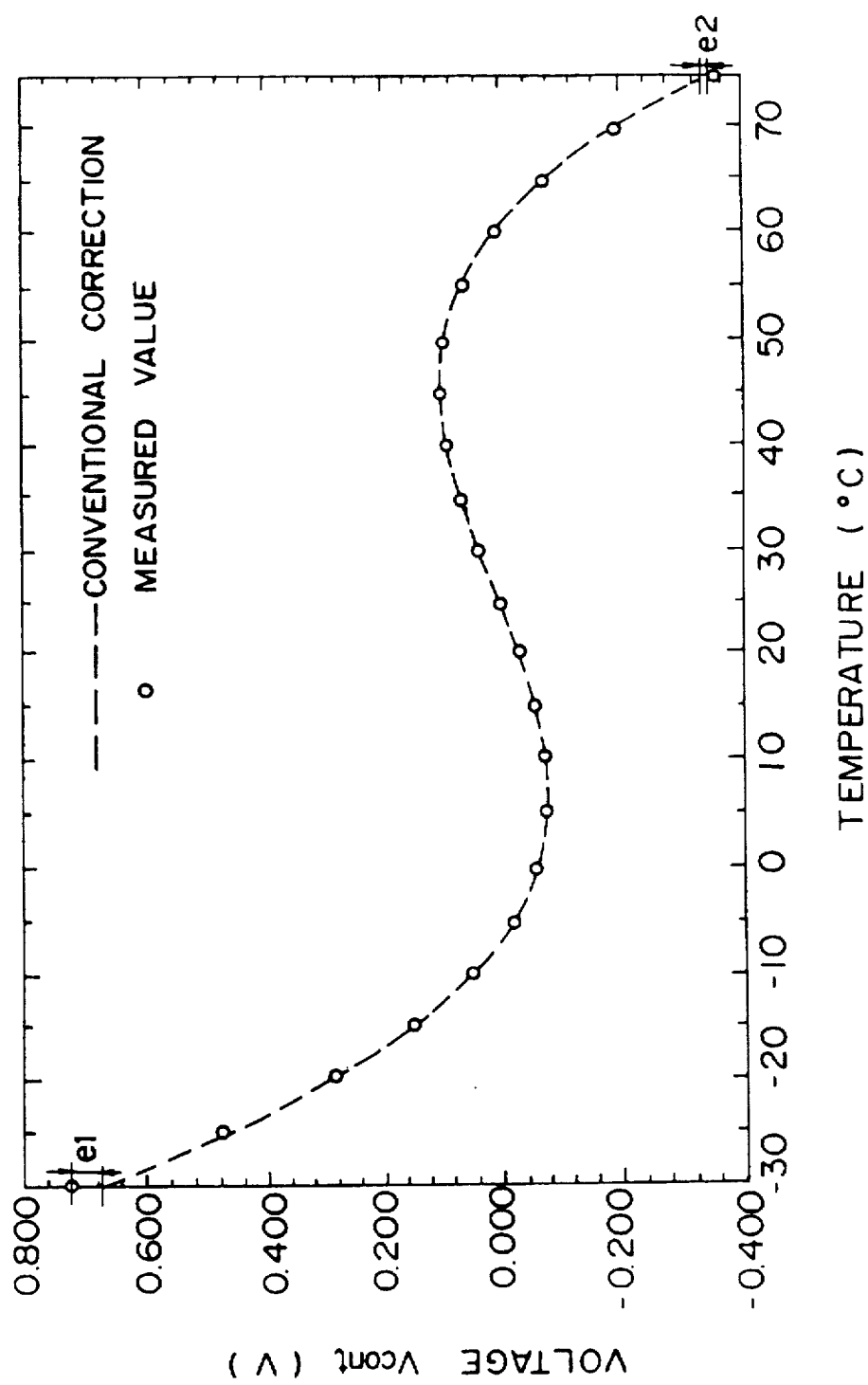
FIG. 17 shows the control voltage relative to the temperature obtained by a conventional frequency correcting method.
Figure 18:
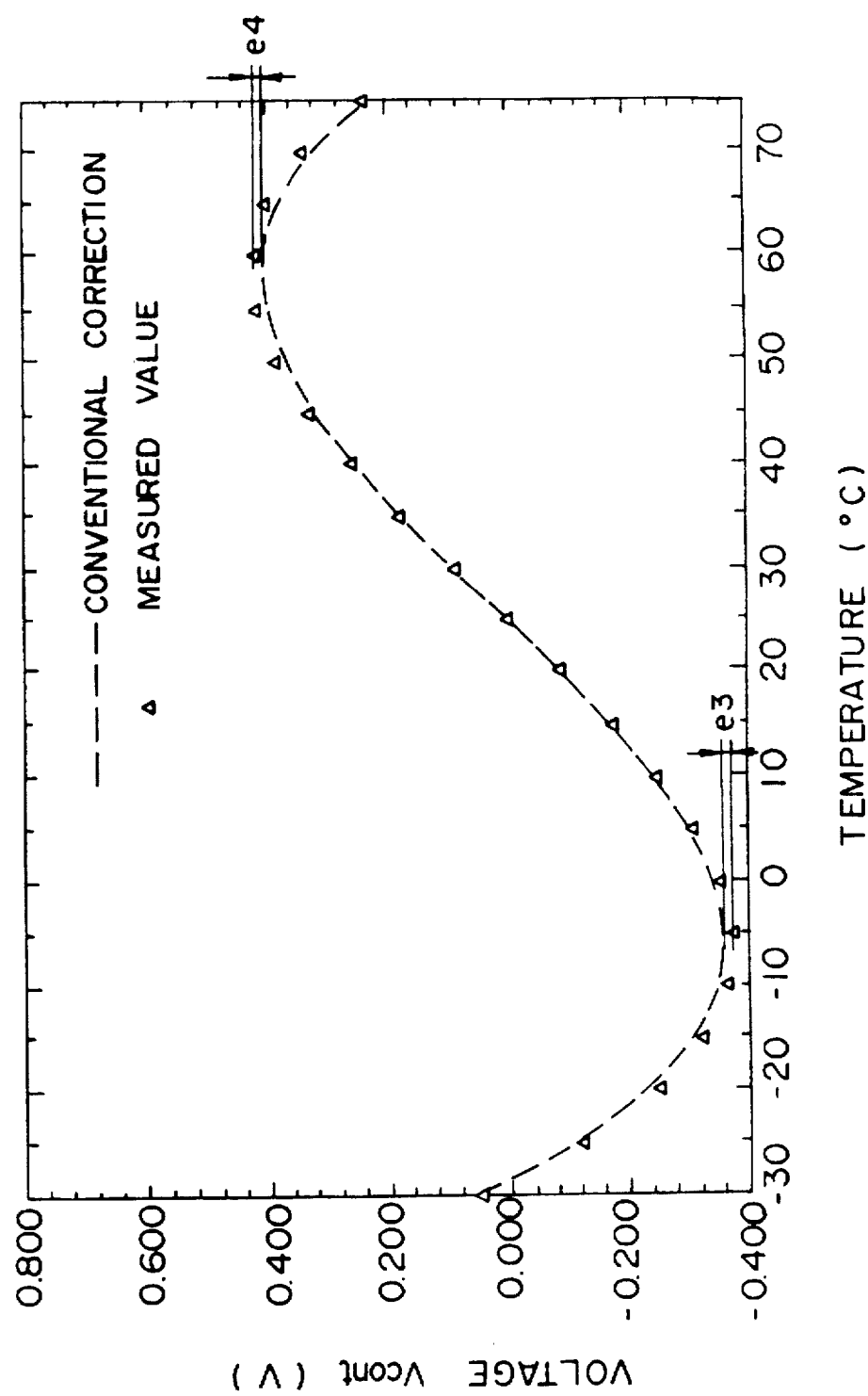
FIG. 18 shows the control voltage relative to the temperature obtained by a conventional frequency correcting method.

Further, the slopes K of the straight lines shown in FIG. 3 are not uniform over the entire control voltage range. That is, the control voltage-frequency deviation characteristic of each variable-capacitance diode is given by an approximately linear expression. Accordingly, an error arises if correction is made using a control voltage (correction voltage) $V_i$ which is given by the linear expression (1) with a slope K different from that of the nonlinear voltage value portion. For example, in the case of a crystal resonator 45 having a temperature characteristic such as that shown by MIN in FIG. 9, the frequency correction results in as shown in FIG. 17. That is, the largest error $e_1$ is 0.6 ppm in terms of the output frequency. In the case of a crystal resonator 45 having a temperature characteristic such as that shown by MAX in FIG. 9, the frequency correction results in as shown in FIG. 18. That is, the largest error $e_3$ is 0.5 ppm in terms of the output frequency. These errors, considered together with other error factors of the crystal resonator 45, exceed 1 ppm and do not meet the requirements that the frequency deviation shall be within ±1 ppm in the temperature range of from −20° C. to 60° C., as specified by RCR-STD (RCR Standards).

Therefore, in this embodiment, the control voltage to be applied to a variable-capacitance diode used for temperature compensation is controlled according to the control voltage-frequency deviation characteristic of the diode which is divided into a plurality of control sections, thereby improving the frequency accuracy.

The block arrangement of a digital temperature-compensated crystal oscillator to which the frequency correcting method according to this embodiment is applied, and the oscillation circuit, are the same as those shown in FIGS. 1 and 2; therefore, description thereof is omitted.

Figure 19:
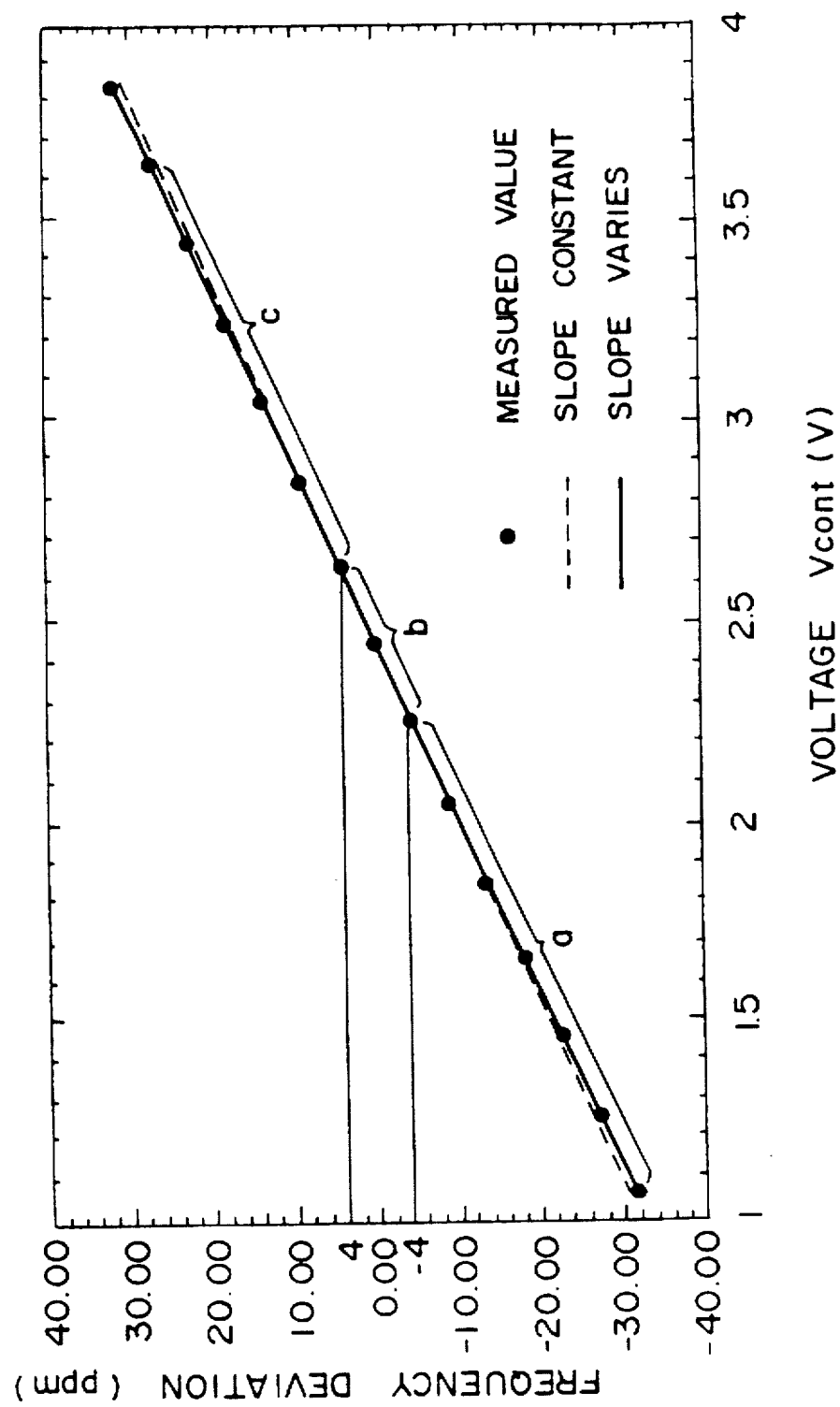
FIG. 19 shows the characteristic of a variable-capacitance diode used in a frequency correcting method according to the present invention.

FIG. 19 shows the characteristic of a variable-capacitance diode used in the frequency correcting method according to the present invention. As illustrated in the figure, the slope K of the variable-capacitance diode 42 is slightly different for the central portion than for both end portions. For example, in the control section b, in which the frequency deviation is from zero to ±4 ppm, K is 0.057, whereas, in the control sections a and c, K is 0.06. It should be noted that the slope K is represented by the above expression (5). A control voltage (correction voltage) to be applied to the variable-capacitance diode 42 is calculated according to the above expression (4) ($V_f = V_0 - \Delta f_i \cdot K$), and the calculated control voltage is applied to the variable-capacitance diode 42.

The crystal resonator 45 exhibits a temperature characteristic such as that shown in FIG. 9, which is generally given by a cubic expression with respect to temperature. The slope K of the variable-capacitance diode 42 and the temperature characteristic (cubic expression) of the crystal resonator 45 are previously stored in the memory 67. The CPU 64 calculates a frequency deviation from the temperature detected with the temperature sensor 62 and the temperature characteristic of the crystal resonator 45. Then, the CPU 64 calculates a control voltage by the expression (1) using the slope K of the variable-capacitance diode 42 in the corresponding control section among the three control sections a, b and c, and applies the calculated control voltage to the variable-capacitance diode 42.

Figure 20:
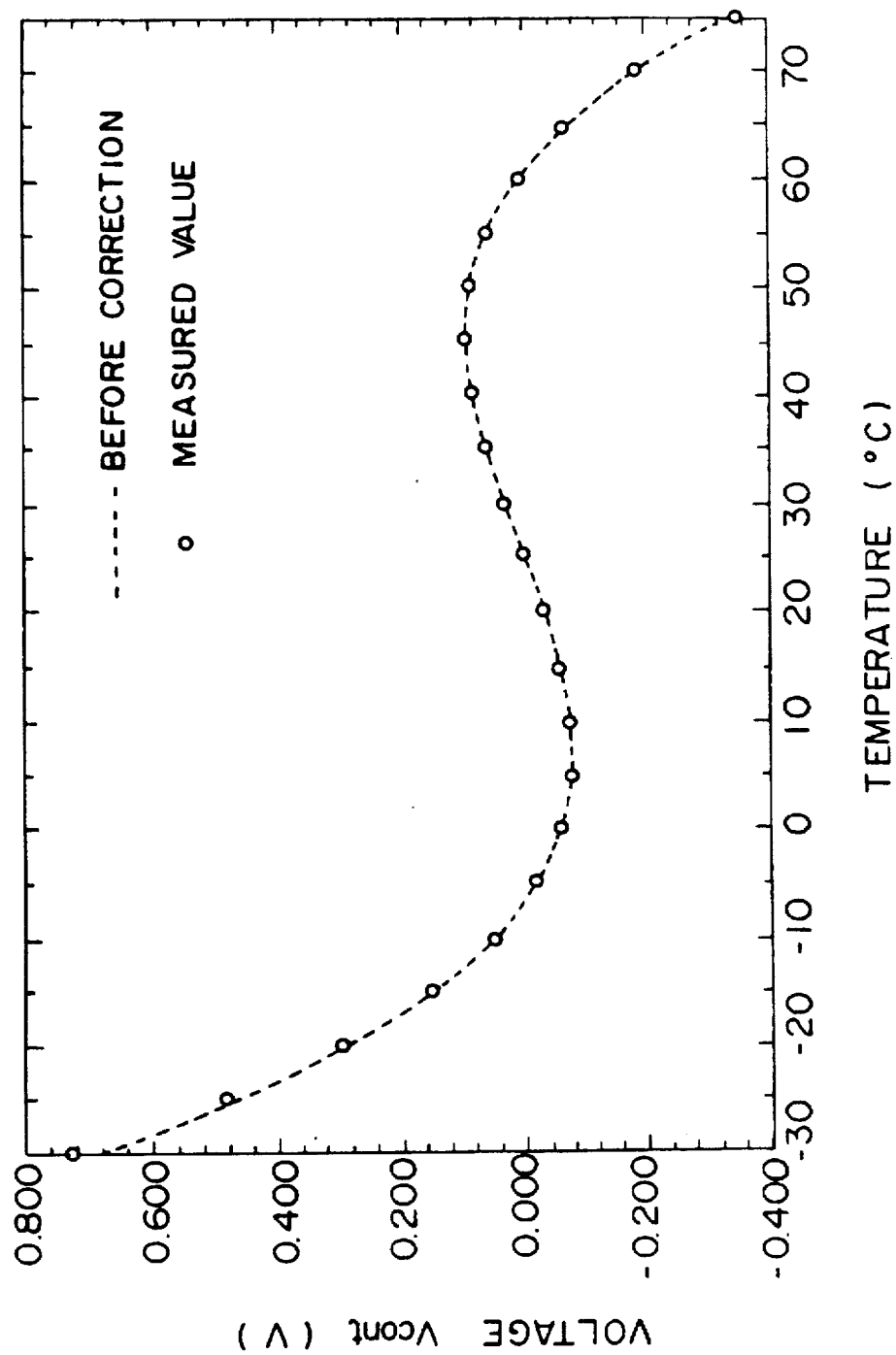
FIG. 20 shows the control voltage relative to the temperature obtained by a frequency correcting method according to the present invention.
Figure 21:
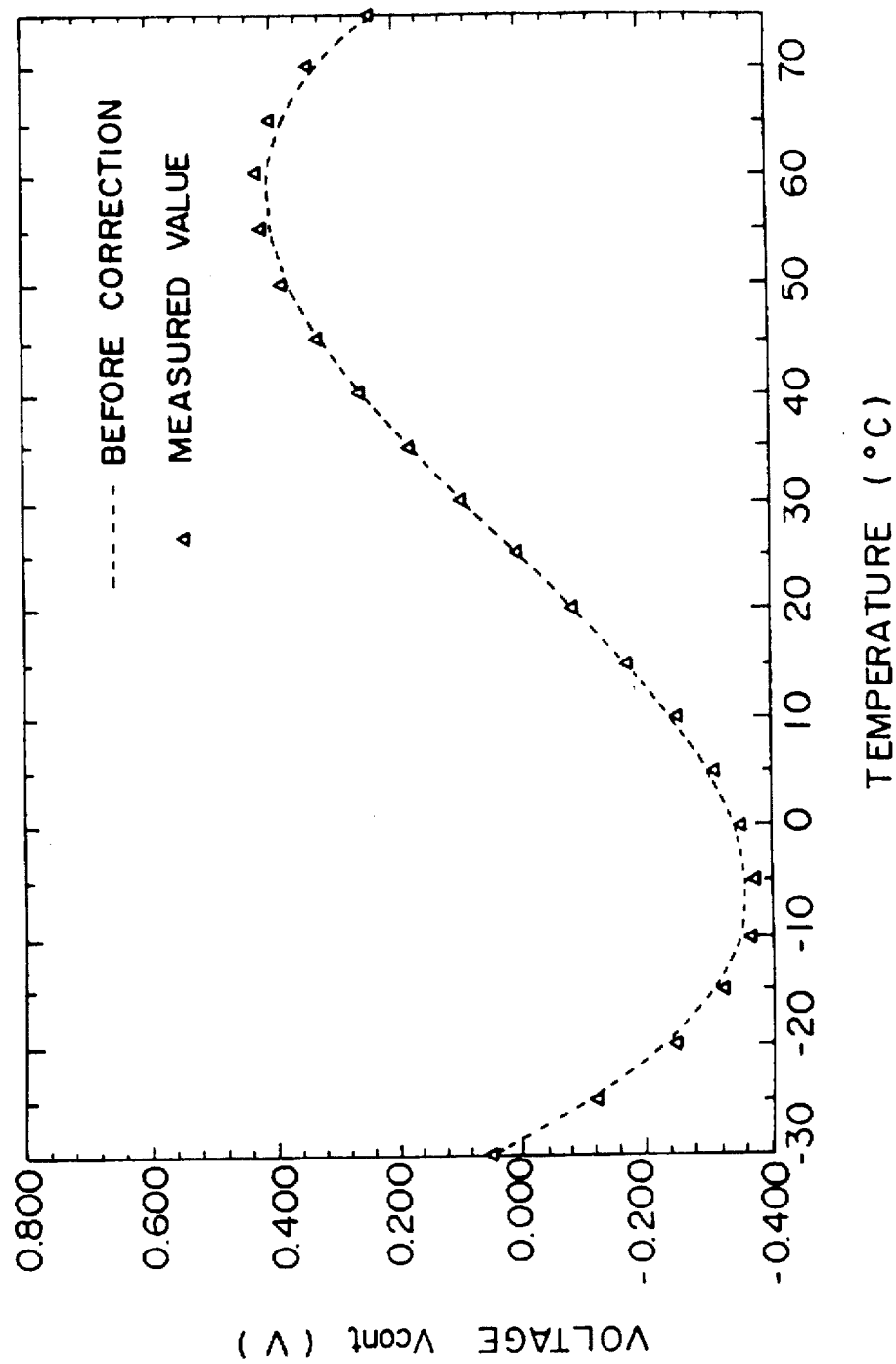
FIG. 21 shows the control voltage relative to the temperature obtained by a frequency correcting method according to the present invention.

FIG. 20 shows the way in which the control voltage ($V_{cont}$) is changed relative to the temperature by the frequency correcting method according to the present invention. In this case, a crystal resonator having a temperature characteristic such as that shown by MIN in FIG. 9 is used. Thus, the frequency deviation (error) can be kept within 0.1 ppm by changing the control voltage relative to the temperature as shown in FIG. 20. FIG. 21 also shows the way in which the control voltage ($V_{cont}$) is changed relative to the temperature by the frequency correcting method according to the present invention. In this case, a crystal resonator having a temperature characteristic such as that shown by MAX in FIG. 9 is used. Thus, the frequency deviation (error) can also be kept within 0.1 ppm by changing the control voltage relative to the temperature as shown in FIGS. 20 and 21.

Although in the above-described embodiment the control voltage to be applied to the variable-capacitance diode 42 is controlled according to the control voltage-frequency deviation characteristic of the diode 42 which is divided into three control sections, if the number of control sections is increased, the frequency control becomes even more accurate.

As has been described above, the control voltage-frequency deviation characteristic of the variable-capacitance diode 42 is divided into three control sections a, b and c, as shown in FIG. 19, and the slope K ($K = (V - V_0)/\Delta f$; see the above expression (5)) of the variable-capacitance diode 42 is set for each control section on the basis of measured values. Therefore, frequency deviations (errors) reduce in all the control sections, and thus it is possible to effect even more accurate frequency control than in the conventional practice.

Thus, according to the frequency correcting method, the control voltage-frequency deviation characteristic of a variable-capacitance diode used for temperature compensation is divided into a plurality of control sections, and a slope K of the variable-capacitance diode is set for each control section on the basis of measured values. Therefore, frequency deviations (errors) reduce in all the control sections, and thus it is possible to effect even more accurate frequency control than in the conventional practice.

Further, according to the method of the present invention, frequency correction can be realized simply by storing the necessary coefficients in the memory using the conventional hardware as it is. Therefore, no extra cost is required. Furthermore, because no feedback control is used, the control operation is rapidly stabilized. Therefore, the present invention is most suitable for use in portable telephones.

What we claim is:

1. A method of calculating an oscillation frequency of a crystal resonator by obtaining each coefficient of a temperature characteristic of the crystal resonator which is expressed by a polynomial of degree n ($n \geq 3$) with respect to temperature, the method comprising:

using a mean value as m ($1 \leq m < n$) coefficient among n coefficients of the polynomial, and determining the remaining n-m coefficients and a constant from n-m+1 temperature points and frequency data measured at the temperature points, thereby calculating an oscillation frequency.

2. The method of claim 1, wherein the polynomial of degree n is approximated by a cubic expression having a constant and first, second and third degree coefficients, wherein a mean value is used as the third degree coefficient and wherein each of the constant and the first and second degree coefficients are determined from three temperature points and frequency data measured at the three temperature points.

3. The method of claim 1, wherein the polynomial of degree n is approximated by a cubic expression having a constant and first, second and third degree coefficients, wherein a mean value is used as each of the second and third degree coefficients, and wherein the first degree coefficient and the constant are determined from two temperature points and frequency data measured at the two temperature points.

4. In a digital control oscillation circuit having a CPU, a memory, a temperature sensor, a crystal resonator, and a variable-capacitance diode, wherein a change of a resonance frequency of the crystal resonator caused by a temperature change is corrected by controlling a control voltage applied to the variable-capacitance diode, a frequency correcting method comprising:

providing a frequency deviation characteristic of the variable-capacitance diode with respect to the control voltage in the form of a linear expression for a linear portion which includes a point at which frequency deviation is zero, storing a first degree coefficient of the linear expression and a temperature characteristic of the crystal resonator in the memory, calculating, under control of the CPU, a frequency deviation from the temperature characteristic of the crystal resonator of a temperature detected by the temperature sensor, obtaining a control voltage to be applied to the variable-capacitance diode from the linear expression expressed by the first degree coefficient, and applying the control voltage to the variable-capacitance diode, whereby output frequency is controlled at a substantially constant predetermined level.

5. In a digital control oscillation circuit including a CPU, a memory, a temperature sensor, a crystal resonator, and a variable-capacitance diode, and in which a change of a resonance frequency of the crystal resonator caused by a temperature change is corrected by controlling a control voltage applied to the variable-capacitance diode, thereby outputting a constant frequency, a frequency correcting method comprising:

dividing a control voltage-frequency deviation characteristic of the variable-capacitance diode into a plurality of appropriate control sections, expressing a frequency deviation in each control section as a linear expression with respect to control voltage, and storing a first degree coefficient of each linear expression, together with a temperature characteristic of the crystal resonator, in the memory, calculating, under control of the CPU, a frequency deviation from the temperature characteristic of the crystal resonator according to a temperature detected with the temperature sensor, obtaining a control voltage to be applied to the variable-capacitance diode by using the first degree coefficient for a corresponding control section, and applying the control voltage to the variable capacitance diode, thereby controlling an output frequency at a substantially constant predetermined level.

* * * * *